US 8,444,791 B2

(12) United States Patent
Ichiyanagi et al.

(10) Patent No.: US 8,444,791 B2
(45) Date of Patent: May 21, 2013

(54) METHOD FOR MANUFACTURING CERAMIC CAPACITOR

(75) Inventors: Seiji Ichiyanagi, Kitanagoya (JP); Kenji Murakami, Kani (JP); Motohiko Sato, Konan (JP); Jun Otsuka, Konan (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 238 days.

(21) Appl. No.: 12/791,332

(22) Filed: Jun. 1, 2010

(65) Prior Publication Data

US 2010/0300602 A1 Dec. 2, 2010

(30) Foreign Application Priority Data

Jun. 1, 2009 (JP) .................. 2009-132290

(51) Int. Cl.
*C03B 29/00* (2006.01)
*B29C 65/00* (2006.01)
*B32B 37/00* (2006.01)
*H01L 21/20* (2006.01)

(52) U.S. Cl.
USPC .......... 156/89.12; 156/60; 156/250; 156/268; 156/267; 438/388

(58) Field of Classification Search
USPC ............ 156/89.12, 60, 268, 267; 438/388
See application file for complete search history.

(56) References Cited

U.S. PATENT DOCUMENTS

| | | | | |
|---|---|---|---|---|
| 6,045,714 | A * | 4/2000 | Humenik et al. | 216/17 |
| 6,276,995 | B1 * | 8/2001 | Matsuta et al. | 451/41 |
| 6,905,936 | B2 * | 6/2005 | Murakami et al. | 438/381 |
| 7,863,662 | B2 | 1/2011 | Sato et al. | |
| 8,304,321 | B2 * | 11/2012 | Sato et al. | 438/388 |

(Continued)

FOREIGN PATENT DOCUMENTS

| | | |
|---|---|---|
| JP | 2004-172305 | 6/2004 |
| JP | 2005-039243 A | 2/2005 |
| JP | 2007-173626 A | 7/2007 |

OTHER PUBLICATIONS

Commonly Owned, Co-Pending U.S. Appl. No 12/791,303, filed Jun. 1, 2010; Inventors: Seiji Ichiyanagi, Kenji Murakami, Motohiko Sato, Jun Otsuka, and Masahiko Okuyama.

*Primary Examiner* — Philip Tucker
*Assistant Examiner* — Alex Efta
(74) *Attorney, Agent, or Firm* — Stites & Harbison PLLC; Jeffrey A. Haeberlin; Nicolo Davidson

(57) ABSTRACT

A method for manufacturing a ceramic capacitor embedded in a wiring substrate, the ceramic capacitor including a capacitor body which has a pair of capacitor main surfaces and a plurality of capacitor side surfaces also has a structure in which a plurality of internal electrodes are alternately layered through a ceramic dielectric layer, the method has (a) laminating ceramic-made green sheets and combining the green sheets into one, to form a multi-device-forming multilayer unit in which a plurality of product areas, each of which becomes the ceramic capacitor, are arranged in longitudinal and lateral directions along a plane direction, (b) forming a groove portion to form a chamfer portion at a boundary portion between at least one of the capacitor main surfaces and the plurality of capacitor side surfaces, (c) sintering the multi-device-forming multilayer unit, and (d) dividing the product areas into each product area along the groove portion.

14 Claims, 19 Drawing Sheets

U.S. PATENT DOCUMENTS

| | | |
|---|---|---|
| 2005/0207091 A1 | 9/2005 | Kambe et al. |
| 2007/0026196 A1* | 2/2007 | Ogawa et al. .................. 428/157 |
| 2007/0045814 A1* | 3/2007 | Yamamoto et al. ............ 257/698 |
| 2007/0145449 A1* | 6/2007 | Sato et al. ..................... 257/295 |
| 2011/0083794 A1 | 4/2011 | Sato et al. |
| 2011/0090615 A1 | 4/2011 | Sato et al. |

* cited by examiner

METHOD FOR MANUFACTURING CERAMIC CAPACITOR

BACKGROUND OF THE INVENTION

The present invention relates to a method for manufacturing a ceramic capacitor embedded in a wiring substrate.

In recent years, a semiconductor integrated circuit device (IC chip) used as a microprocessor etc. for a computer has increasingly increased in speed and performance, and the number of terminals has increased also a terminal pitch has narrowed with increase in these speed and performance. Normally, a number of terminals are densely arranged in an array pattern on a bottom surface of the IC chip, and such terminal group are connected with terminal group on a motherboard side through flip-chip mounting. Here, there is a large difference in terminal pitch between the terminal group on the IC chip side and the terminal group on the motherboard side, it is therefore difficult to directly mount and connect the IC chip on and with the motherboard. For this problem, such a manner that a package in which the IC chip is mounted on an IC chip mounting wiring substrate is prepared and this package is mounted on the motherboard, is normally employed. Regarding the IC chip mounting wiring substrate that is a component of this kind of package, it has been proposed that a capacitor be provided in the IC chip mounting wiring substrate for reducing switching noises of the IC chip and for stabilizing power supply voltage. As an example, Patent Document 1 (Japanese Patent Provisional Publication No. 2005-39243 (JP2005-39243)) discloses a wiring substrate, e.g. in FIG. 4. This wiring substrate has a core substrate, which is made of polymeric material, and build-up layers. More specifically, a ceramic capacitor is embedded in the core substrate, and the build-up layers are formed on a front surface and a back surface of the core substrate, then the wiring substrate having such configuration is provided.

In the following, an example of a manufacturing method of the related art wiring substrate will be explained with reference to FIGS. 31 and 32.

First, a core substrate 204 made of the polymeric material is provided. The core substrate 204 has an installation opening part 203 that opens on both sides of a core main surface 201 and a core back surface 202 (see FIG. 31). In addition, a ceramic capacitor 208 is provided. The ceramic capacitor 208 has a pair of capacitor main surfaces (first and second capacitor main surfaces) 205 and four capacitor side surfaces 206, and a plurality of projecting surface layer electrodes 207 are formed on the both capacitor main surfaces 205.

Second, a taping process in which an adhesive tape 209 is taped on the core back surface 202 side is performed, then the opening of the installation opening part 203 on the core back surface 202 side is previously sealed. Subsequently, an installation process in which the ceramic capacitor 208 is installed in the installation opening part 203 is performed, then the capacitor main surface 205 is stuck to an adhesive surface of the adhesive tape 209 for a temporary fixation (see FIG. 31).

Next, a gap between an inner surface of the installation opening part 203 and the capacitor side surface 206 is filled with a filling material 210 that is made of resin insulation material (see FIG. 32). Here, the filling material 210 has the function of fixing the ceramic capacitor 208 to the core substrate 204 with the filling material 210 being contiguous with an outer surface of the ceramic capacitor 208. Afterwards, a resin interlayer insulation layer that is made of mainly polymeric material and a conductor layer are alternately formed on the core main surface 201 also on the core back surface 202 of the core substrate 204, then the build-up layers are formed. Through these processes, a desired wiring substrate is obtained.

In such wiring substrate, however, when a stress is applied to the filling material 210 due to heat etc. generated during operation of the IC chip, the stress concentrates at a corner portion 200 (a boundary portion between the first capacitor main surface 205 and the capacitor side surface 206) of the ceramic capacitor 208, and there is a possibility that a crack will appear in the filling material 210. This crack could become a factor that breaks the build-up layer that is contiguous to the filling material 210. Therefore, for instance, in Patent Document 2 (Japanese Patent Provisional Publication No. 2004-172305 (JP2004-172305)), by polishing the ceramic capacitor 208 through a barrel finishing process for a certain time, a curved chamfer portion (not shown) is formed at the boundary portion between the first capacitor main surface 205 and the capacitor side surface 206. With this technique, since the stress concentration to the corner portion 200 of the ceramic capacitor 208 relaxes by the chamfer portion, it is conceivable that the occurrence of the crack in the filling material 210 could be prevented.

RELATED ART DOCUMENTS

Patent Document 1: Japanese Patent Provisional Publication No. 2005-39243 (JP2005-39243) (FIG. 4 etc.)
Patent Document 2: Japanese Patent Provisional Publication No. 2004-172305 (JP2004-172305) ([0039], FIG. 1 etc.)

SUMMARY OF THE INVENTION

However, because the ceramic capacitor 208 has a thin plate shape, there is a high possibility that the ceramic capacitor 208 will break or chip upon the polishing of the barrel finishing process. In addition, in a related art technique in Patent Document 2, the chamfer portion is formed through the barrel finishing process after a sintering (burning or firing) process of the ceramic capacitor 208. In this case, since a solid ceramic dielectric layer after the sintering is polished, i.e. since the ceramic dielectric layer that becomes rigid by the sintering is polished, this gives rise to such problems that a polishing process time becomes long and a manufacturing cost increases.

It is therefore an object of the present invention to provide a method for manufacturing the ceramic capacitor, which is capable of forming the chamfer portion in a short time and at a low cost.

According to one aspect of the present invention, a method for manufacturing a ceramic capacitor embedded in a wiring substrate with a resin insulation material being contiguous with an outer surface of the ceramic capacitor, wherein the ceramic capacitor includes a plate-shaped capacitor body having a pair of capacitor main surfaces which are positioned on opposite sides to each other in a thickness direction and a plurality of capacitor side surfaces and having a structure in which a plurality of internal electrodes are alternately layered through a ceramic dielectric layer, the method comprises: laminating ceramic-made green sheets, each of which becomes the ceramic dielectric layer afterwards, and combining the green sheets into one, to form a multi-device-forming multilayer unit in which a plurality of product areas, each of which becomes the ceramic capacitor, are arranged in longitudinal and lateral directions along a plane direction; forming a groove portion to form a chamfer portion at a boundary portion between at least one of the capacitor main surfaces and the plurality of capacitor side surfaces through a process along an outline of the product area; sintering the multi-device-forming multilayer unit after the forming of the groove portion; and dividing the product areas into each product area along the groove portion after the sintering.

According to another aspect of the present invention, a method for manufacturing a ceramic capacitor embedded in a wiring substrate with a resin insulation material being contiguous with an outer surface of the ceramic capacitor, wherein the ceramic capacitor includes a plate-shaped capacitor body having a pair of capacitor main surfaces which are positioned on opposite sides to each other in a thickness direction and a plurality of capacitor side surfaces and having a structure in which a plurality of internal electrodes are alternately layered through ceramic dielectric layers, the capacitor body has a first dielectric multilayer section in which the plurality of ceramic dielectric layers and the plurality of internal electrodes are alternately layered and a second dielectric multilayer section that is provided so as to be exposed at least one of the pair of capacitor main surfaces, and a chamfer portion is formed at a boundary portion between at least one of the capacitor main surfaces and the plurality of capacitor side surfaces, the method comprises: laminating ceramic-made green sheets, each of which becomes the ceramic dielectric layer afterwards, and combining the green sheets into one, to form a multi-device-forming multilayer unit in which a plurality of product areas, each of which becomes the ceramic capacitor, are arranged in longitudinal and lateral directions along a plane direction; forming a groove portion to form the chamfer portion by performing a laser processing along an outline of the product area; sintering the multi-device-forming multilayer unit after the forming of the groove portion; and dividing the product areas into each product area along the groove portion after the sintering.

The other objects and features of this invention will become understood from the following description with reference to the accompanying drawings.

DETAILED DESCRIPTION OF THE INVENTION

Embodiments of the present invention will be explained below with reference to the drawings.

Figure 1:
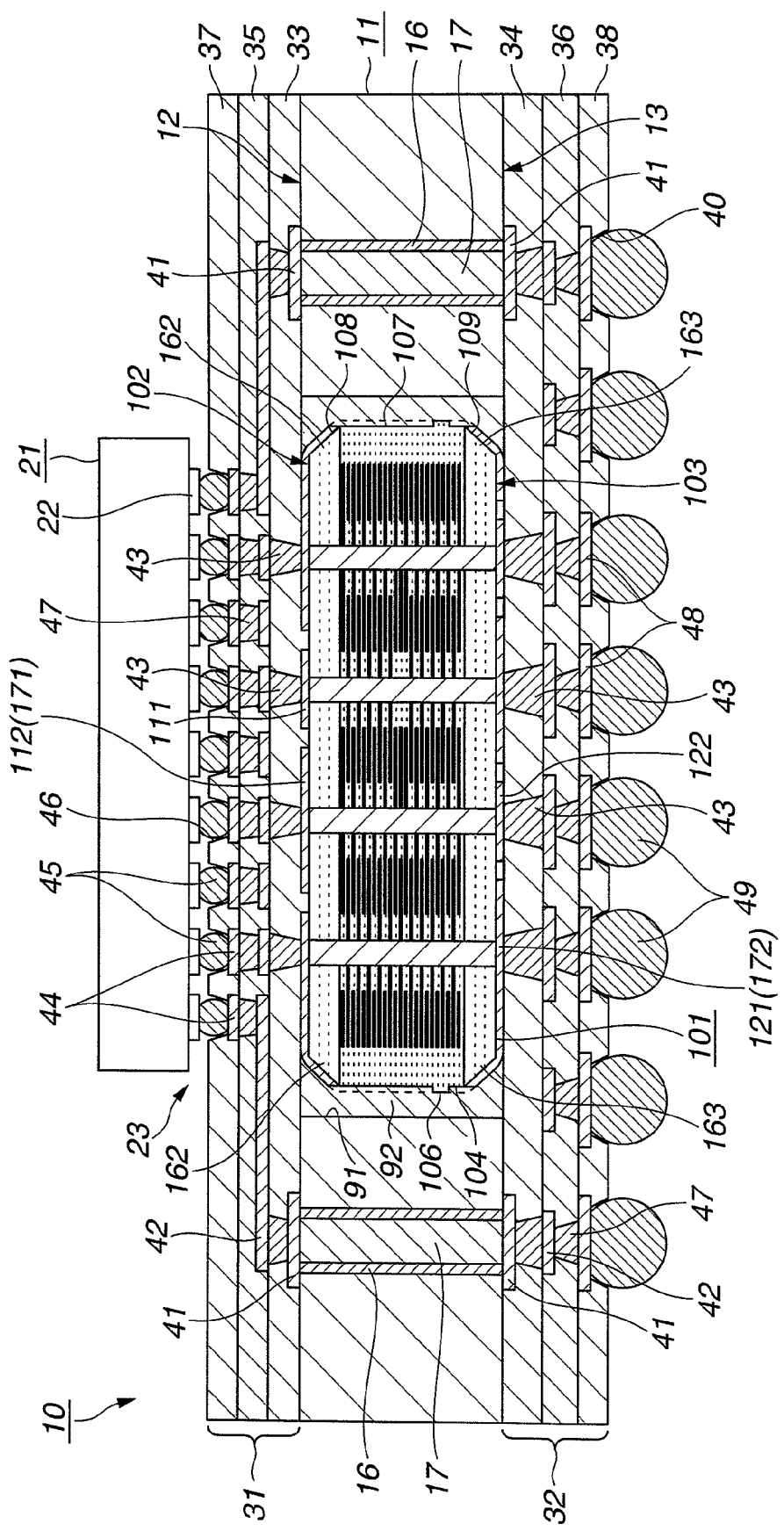
FIG. 1 is a schematic sectional view of a wiring substrate according to an embodiment of the present invention.

As shown in FIG. 1, a wiring substrate 10 of the present invention is a wiring substrate for IC chip mounting. The wiring substrate 10 has a substantially rectangular plate core substrate 11, a main surface side build-up layer 31 (a wiring multilayer section) that is formed on a core main surface 12 of the core substrate 11, and a back surface side build-up layer 32 (a wiring multilayer section) that is formed on a core back surface 13 of the core substrate 11.

A shape of the core substrate 11, viewed from above, is the substantially rectangular plate shape, and its size is length 25 mm×width 25 mm×thickness 1.0 mm. A thermal expansion coefficient in a plane direction (X-Y direction) of the core substrate 11 is approximately 10~30 ppm/° C. (more accurately, 18 ppm/° C.). Here, the thermal expansion coefficient of the core substrate 11 is an average of measurement values from 0° C. to a glass transition temperature (Tg). In the core substrate 11, a through hole conductor 16 is formed at a plurality of positions.

The through hole conductor 16 electrically connects the core main surface 12 side and the core back surface 13 side of the core substrate 11. An inside of the through hole conductor 16 is filled with a plug 17 such as epoxy resin. Further, a conductor layer 41 that is made of copper is formed through a patterning on the core main surface 12 and the core back surface 13 of the core substrate 11. Each conductor layer 41 is electrically connected with the through hole conductor 16.

As can be seen in FIG. 1, the main surface side build-up layer 31 has a structure in which two layers of a first and a second resin interlayer insulation layers 33, 35 which are made of thermosetting resin (epoxy resin) and a conductor layer 42 which is made of copper are alternately layered. In the present embodiment, a thermal expansion coefficient of the resin interlayer insulation layers 33, 35 is approximately 10~60 ppm/° C. (more accurately, 30 ppm/° C.). Here, the thermal expansion coefficient of the resin interlayer insulation layers 33, 35 is an average of measurement values from 30° C. to a glass transition temperature (Tg). On a surface of the second resin interlayer insulation layer 35, a terminal pad 44 is formed at a plurality of positions. More specifically, a plurality of the terminal pads 44 are arranged in an array pattern. Furthermore, the surface of the second resin interlayer insulation layer 35 is almost entirely covered with a solder resist 37. An opening area 46 to expose the terminal pad 44 is formed at a certain position of the solder resist 37.

On the terminal pad 44, a plurality of solder bumps 45 are provided. Each solder bump 45 is electrically connected with a rectangular flat surface connection terminal 22 of an IC chip 21. Here, an area where each terminal pad 44 and each solder bump 45 are formed is an IC chip mounting area 23 where the IC chip 21 is able to be mounted. This IC chip mounting area 23 is provided on a surface of the main surface side build-up layer 31. In addition, via conductors 43, 47 are formed in the first and second resin interlayer insulation layers 33, 35 respectively. These via conductors 43, 47 electrically connect the conductor layer 42 and the terminal pad 44.

The back surface side build-up layer 32 has a substantially same structure as the main surface side build-up layer 31, as shown in FIG. 1. That is, the back surface side build-up layer 32 has a structure in which two layers of a first and a second resin interlayer insulation layers 34, 36 which are made of thermosetting resin (epoxy resin) and a conductor layer 42 are alternately layered. And a thermal expansion coefficient of the resin interlayer insulation layers 34, 36 is approximately 10~60 ppm/° C. (more accurately, 30 ppm/° C.). On a lower surface of the second resin interlayer insulation layer 36, a BGA (Ball Grid Array) pad 48 is formed at a plurality of positions. More specifically, a plurality of BGA pads 48 are arranged in an array pattern. This BGA pad 48 is electrically connected to the conductor layer 42 through the via conductor 47. Furthermore, the lower surface of the second resin interlayer insulation layer 36 is almost entirely covered with a solder resist 38. An opening area 40 to expose the BGA pad 48 is formed at a certain position of the solder resist 38.

On the BGA pad 48, a plurality of solder bumps 49 to establish electric connection with a motherboard (not shown) are provided. Then the wiring substrate 10 shown in FIG. 1 is mounted on the motherboard through the solder bumps 49.

As shown in FIG. 1, the core substrate 11 has an installation opening part 91 whose shape, viewed from above, is a substantially rectangular shape. The installation opening part 91 opens in the middles of the core main surface 12 and the core back surface 13, namely that the installation opening part 91 is a penetrating hole. A ceramic capacitor 101 is installed in the installation opening part 91 with the ceramic capacitor 101 embedded in the installation opening part 91. More specifically, the ceramic capacitor 101 is installed with its first capacitor main surface 102 facing to the same side as the core main surface 12. Here, a ceramic sintered compact 104, which is provided for the ceramic capacitor 101 in the present embodiment, has a rectangular plate shape, and its size is length 15.0 mm×width 15.0 mm×thickness 0.8 mm. Thus an aspect ratio, which is defined by a value that is obtained by dividing the length (0.8 mm) of a thickness direction of the ceramic sintered compact 104 by the length (15.0 mm) of a plane direction of the ceramic sintered compact 104, is approximately 0.053.

A gap between an inner surface of the installation opening part 91 and capacitor side surfaces 181~184 of the ceramic capacitor 101 is filled with a filling material 92 that is made of resin insulation material (in the present embodiment, thermosetting resin). This filling material 92 has the function of fixing the ceramic capacitor 101 to the core substrate 11 and also absorbing deformation in a surface direction (or plane direction) and the thickness direction of the ceramic capacitor 101 and the core substrate 11 by elastic deformation of the filling material 92. That is to say, the ceramic capacitor 101 is installed in the wiring substrate 10 with the filling material 92 being contiguous with an outer surface of the ceramic capacitor 101. In the present embodiment, a thermal expansion coefficient in a fully hardened state, of the filling material 92 is approximately 10~60 ppm/° C., and more accurately, it is approximately 20 ppm/° C. The thermal expansion coefficient in the fully hardened state, of the filling material 92 is an average of measurement values from 30° C. to a glass transition temperature (Tg).

As is clear from FIG. 1, the ceramic capacitor 101 is placed in an area just below the IC chip mounting area 23 in the core substrate 11. With regard to an area of the IC chip mounting area 23 (i.e. an area of the surface where the surface connection terminal 22 is formed on the IC chip 21), the area of the IC chip mounting area 23 is set to be smaller than an area of the first capacitor main surface 102 of the ceramic capacitor 101. When viewed from the thickness direction of the ceramic capacitor 101, the IC chip mounting area 23 is positioned within the first capacitor main surface 102 of the ceramic capacitor 101.

Figure 2:
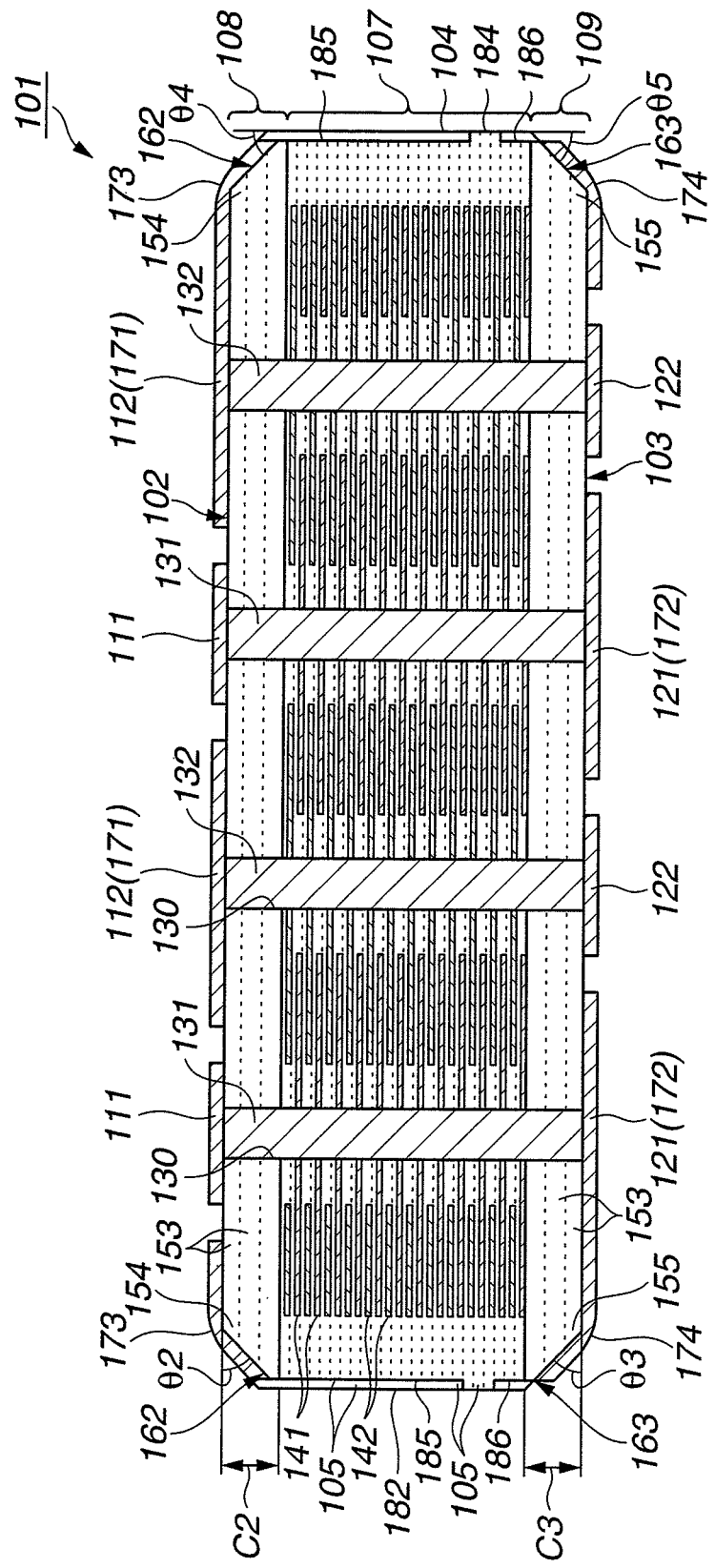
FIG. 2 is a schematic sectional view of a ceramic capacitor.

As shown in FIGS. 1 and 2, the ceramic capacitor 101 in the present embodiment is a so-called via array type capacitor. In the present embodiment, a thermal expansion coefficient of the ceramic sintered compact 104 is less than 15 ppm/° C., and more accurately, it is approximately 12~13 ppm/° C. The thermal expansion coefficient of the ceramic sintered compact 104 is an average of measurement values from 30° C. to 250° C. The ceramic sintered compact 104 (a capacitor body) forming the ceramic capacitor 101 has the substantially rectangular plate shape that includes one first capacitor main surface 102 (an upper surface in FIG. 1), one second capacitor main surface 103 (a lower surface in FIG. 1) and four capacitor side surfaces (first to fourth capacitor side surfaces) 181~184. The first capacitor main surface 102 and the second capacitor main surface 103 are positioned on opposite sides to each other in the thickness direction of the ceramic sintered compact 104.

As shown in FIGS. 2 to 7, on the capacitor side surfaces 182~184, a concave portion 185 that extends in the thickness direction of the ceramic sintered compact 104 is formed at a plurality of positions. A shape of each concave portion 185, viewed from above, is a semicircular shape, and a plurality of concave portions 185 are arranged at regular intervals on each of the capacitor side surfaces 182~184. Further, the concave portions 185 formed on the capacitor side surfaces 182 and 184 are positioned at an edge portion of the first capacitor main surface 102 side on the capacitor side surfaces 182 and 184 (see FIGS. 2 and 3), while the concave portions 185 formed on the third capacitor side surface 183 are positioned at an edge portion of the second capacitor main surface 103 side on the third capacitor side surface 183 (see FIG. 4).

In addition, on the capacitor side surfaces 182~184, a concave portion 186 that extends parallel to the respective capacitor side surfaces 182~184 is formed. The concave portions 186 formed on the capacitor side surfaces 182 and 184 are positioned at the edge portion of the second capacitor main surface 103 side on the capacitor side surfaces 182 and 184 (see FIGS. 2 and 4), while the concave portions 186 formed on the third capacitor side surface 183 are positioned at the edge portion of the first capacitor main surface 102 side on the third capacitor side surface 183 (see FIG. 3).

As shown in FIGS. 1 and 2, the ceramic sintered compact 104 has a capacitor forming layer section 107 (a first dielectric multilayer section), an upper side cover layer section 108 (a second dielectric multilayer section) that covers an upper surface of the capacitor forming layer section 107, and a lower side cover layer section 109 (a second dielectric multilayer section) that covers a lower surface of the capacitor forming layer section 107. The capacitor forming layer section 107 has a structure in which a plurality of ceramic dielectric layers 105 and a plurality of internal electrodes 141, 142 are alternately layered. These internal electrodes 141, 142 are a power supply internal electrode 141 and an earth (or ground) internal electrode 142. The power supply internal electrode 141 and the ground internal electrode 142 are alternately layered and arranged through the ceramic dielectric layer 105. The ceramic dielectric layer 105 is formed from a sintered compact of barium titanate that is a sort of high dielectric constant ceramic, and acts as a dielectric (an insulator) between the power supply internal electrode 141 and the ground internal electrode 142. Both of the power supply internal electrode 141 and the ground internal electrode 142 are conductors that are formed, with nickel being a principal component. In the present embodiment, each thickness of these internal electrodes 141, 142 is set to 2 μm.

Figure 5:
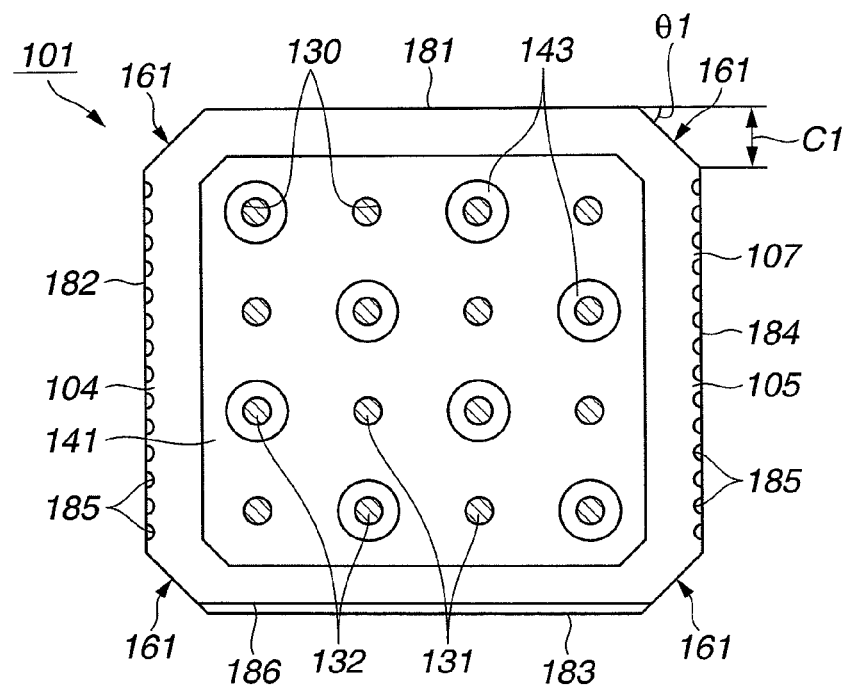
FIG. 5 is a schematic drawing for explaining connection between an internal electrode (a power supply internal electrode) and an in-capacitor via conductor (a power supply in-capacitor via conductor) in a capacitor forming layer section.
Figure 6:
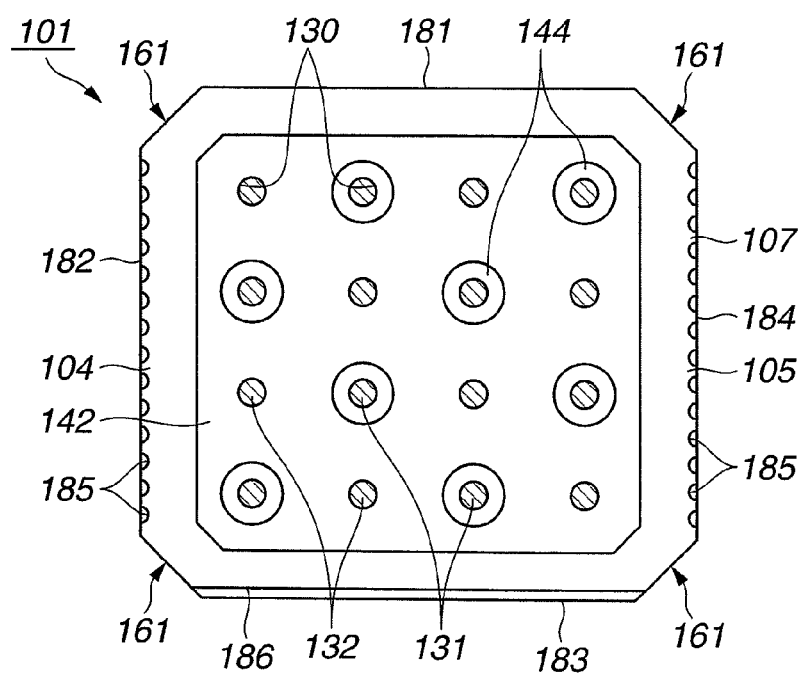
FIG. 6 is a schematic drawing for explaining connection between an internal electrode (an earth (or ground) internal electrode) and an in-capacitor via conductor (an earth (or ground) in-capacitor via conductor) in a capacitor forming layer section.
Figure 7:
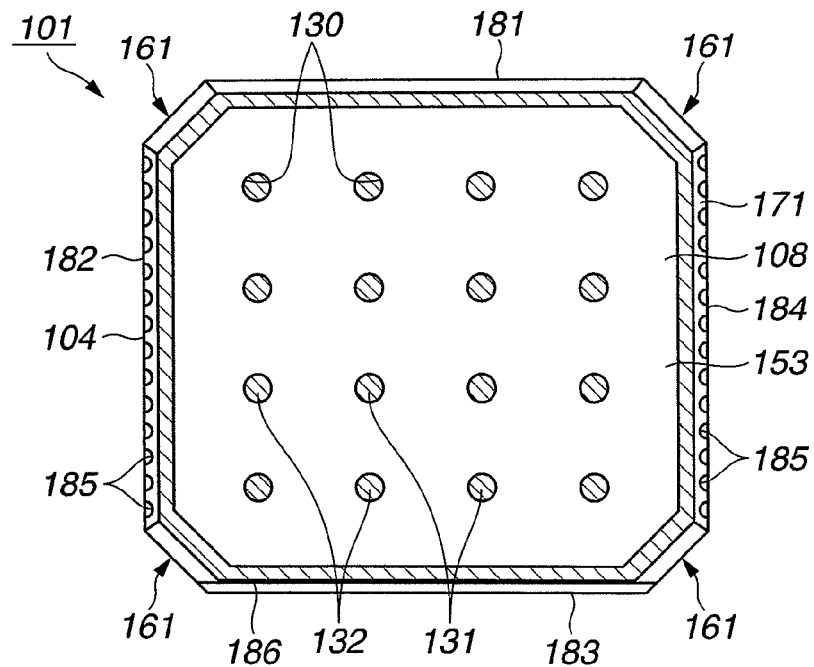
FIG. 7 is a schematic drawing for explaining a cover layer section.

As shown in FIGS. 5 to 7, a plurality of via holes 130 are formed in the ceramic sintered compact 104. These via holes 130 extend along the thickness direction of the ceramic sintered compact 104 and penetrate the ceramic sintered compact 104, and arranged in a grid or lattice pattern (an array pattern) throughout the ceramic sintered compact 104. Although 4×4 array via holes 130 are illustrated in the drawings for convenience of explanation, even more via holes (even more rows and columns) are actually present. As shown in FIG. 2, in-capacitor via conductors (a power supply in-capacitor via conductor and an earth (or ground) in-capacitor via conductor) 131, 132 having nickel as a principal component are formed inside the via hole 130. These plurality of in-capacitor via conductors 131, 132 connect the first capacitor main surface 102 and the second capacitor main surface 103 of the ceramic sintered compact 104. More specifically, each power supply in-capacitor via conductor 131 penetrates each power supply internal electrode 141 (see FIGS. 2 and 5), and these power supply in-capacitor via conductor 131 and power supply internal electrode 141 are electrically connected with each other. On the other hand, each ground in-capacitor via conductor 132 penetrates each ground internal electrode 142 (see FIGS. 2 and 6), and these ground in-capacitor via conductor 132 and ground internal electrode 142 are electrically connected with each other. As is clear from FIG. 5, the power supply internal electrode 141 is a plane (or flat) conductor which is provided with a plurality of clearances 143 (circular open area patterns) around the ground in-capacitor via conductor 132. With this clearance 143, the power supply internal electrode 141 does not contact the ground in-capacitor via conductor 132. Likewise, as is clear from FIG. 6, the ground internal electrode 142 is a plane (or flat) conductor which is provided with a plurality of clearances 144 (circular open area patterns) around the power supply in-capacitor via conductor 131. With this clearance 144, the ground internal electrode 142 does not contact the power supply in-capacitor via conductor 131.

As shown in FIGS. 1 and 2, the upper side and lower side cover layer sections 108, 109 are provided so as to be exposed at surface layer sections of the ceramic sintered compact 104. As explained in more detail below, the upper side cover layer section 108 is provided so as to be exposed at the first capacitor main surface 102. The lower side cover layer section 109 is provided so as to be exposed at the second capacitor main surface 103. Each of the cover layer sections 108, 109 has a structure in which a plurality of ceramic dielectric layers 153 are layered (or laminated). The ceramic dielectric layer 153 is made of the same material (more specifically, barium titanate) as the ceramic dielectric layer 105 of the capacitor forming layer section 107, and is formed to be thicker than the ceramic dielectric layer 105. With this, high insulation property and moisture resistance etc. of the ceramic capacitor 101 can be adequately secured.

As shown in FIGS. 3 to 7, the ceramic sintered compact 104 has a flat shaped side chamfer portion 161 at each of four corners (at a boundary portion between adjacent two capacitor side surfaces). For example, a chamfer length C1 (see FIG. 5) of the side chamfer portion 161 with respect to one capacitor side surface (the first capacitor side surface 181) of the adjacent two capacitor side surfaces 181 and 184, is 0.55 mm or more (in the present embodiment, 0.6 mm). Further, a chamfer angle θ01 (also see FIG. 5) of the side chamfer portion 161 with respect to the first capacitor side surface 181, is 45°. Therefore, an angle between the adjacent first capacitor side surface 181 and side chamfer portion 161 is an obtuse angle (180°−θ1=135°).

As shown in FIG. 2, the cover layer section 108 has a corner portion 154 which is a boundary portion between the first capacitor main surface 102 and each capacitor side surface 181~184 and also is a boundary portion between the first capacitor main surface 102 and the side chamfer portion 161, and a flat shaped chamfer portion 162 is formed at the corner portion 154. Likewise, the cover layer section 109 has a corner portion 155 which is a boundary portion between the second capacitor main surface 103 and each capacitor side surface 181~184 and also is a boundary portion between the second capacitor main surface 103 and the side chamfer portion 161, and a flat shaped chamfer portion 163 is formed at the corner portion 155.

Here, a chamfer depth C2 (see FIG. 2) of the chamfer portion 162 with respect to the first capacitor main surface 102, is 0.1 mm. A chamfer depth C3 (also see FIG. 2) of the chamfer portion 163 with respect to the second capacitor main surface 103, is also 0.1 mm same as the chamfer depth C2. That is, each of the chamfer depths C2, C3 is less than ½ (a half) of the thickness (in the present embodiment, 0.8 mm) of the ceramic sintered compact 104. Furthermore, each of the chamfer depths C2, C3 is ⅙ (a sixth) of the chamfer length C1 (0.6 mm).

As shown in FIG. 2, a chamfer angle θ2 of the chamfer portion 162 with respect to the first capacitor main surface 102, and a chamfer angle θ3 of the chamfer portion 163 with respect to the second capacitor main surface 103, are 45°. Therefore, an angle between the adjacent first capacitor main surface 102 and chamfer portion 162 is an obtuse angle (180°−θ2=135°). An angle between the adjacent second capacitor main surface 103 and chamfer portion 163 is also an obtuse angle (180°−θ3=135°).

Further, a chamfer angle θ4 of the chamfer portion 162 with respect to the capacitor side surface (e.g. the fourth capacitor side surface 184), and a chamfer angle θ5 of the chamfer portion 163 with respect to the capacitor side surface (e.g. the fourth capacitor side surface 184), are also 45°. Therefore, an angle between the adjacent capacitor side surface (e.g. the fourth capacitor side surface 184) and chamfer portion 162 is obtuse angle (180°−θ4=135°). An angle between the adjacent capacitor side surface (e.g. the fourth capacitor side surface 184) and chamfer portion 163 is also an obtuse angle (180°−θ5=135°).

Moreover, a chamfer angle (not shown) of the chamfer portion 162 with respect to the side chamfer portion 161, and a chamfer angle (not shown) of the chamfer portion 163 with respect to the side chamfer portion 161, are also 45°. Therefore, an angle between the adjacent side chamfer portion 161 and chamfer portion 162, and an angle between the adjacent side chamfer portion 161 and chamfer portion 163, are also obtuse angles (180°−45=135°). In the present embodiment, since an angle between the adjacent chamfer portions 162 and an angle between the adjacent chamfer portions 163 are also the obtuse angle, every angle between adjacent two surfaces in the ceramic sintered compact 104 is the obtuse angle.

As shown in FIGS. 1 to 4, on the first capacitor main surface 102 of the ceramic sintered compact 104, a plurality of projecting first power supply electrodes 111 (surface layer electrodes) and a plurality of projecting first earth (or ground) electrodes 112 (surface layer electrodes) are formed. The first power supply electrode 111 is directly connected with an end surface of the first capacitor main surface 102 side at the power supply in-capacitor via conductor 131. The first ground electrode 112 is directly connected with the end surface of the first capacitor main surface 102 side at the ground in-capacitor via conductor 132.

Further, on the second capacitor main surface 103 of the ceramic sintered compact 104, a plurality of projecting second power supply electrodes 121 (surface layer electrodes) and a plurality of projecting second earth (or ground) electrodes 122 (surface layer electrodes) are formed. The second power supply electrode 121 is directly connected with an end surface of the second capacitor main surface 103 side at the power supply in-capacitor via conductor 131. The second ground electrode 122 is directly connected with the end surface of the second capacitor main surface 103 side at the ground in-capacitor via conductor 132. Therefore, the power supply electrodes 111 and 121 are electrically connected with the power supply in-capacitor via conductor 131 and also electrically connected to each power supply internal electrode 141. The ground electrodes 112 and 122 are electrically connected with the ground in-capacitor via conductor 132 and also electrically connected to each ground internal electrode 142.

As seen in FIG. 1, the electrodes 111 and 112 on the first capacitor main surface 102 side are electrically connected to the IC chip 21 through the via conductor 43, the conductor layer 42, the via conductor 47, the terminal pad 44, the solder bump 45 and the surface connection terminal 22 of the IC chip 21. On the other hand, the electrodes 121 and 122 on the second capacitor main surface 103 side are electrically connected to an electrode (a contact) (not shown) that is provided in the motherboard through the via conductor 43, the conductor layer 42, the via conductor 47, the BGA pad 48 and the solder bump 49.

As shown in FIGS. 1 to 4, the electrodes 111, 112 and 121, 122 are formed, with nickel being a principal component, and their surfaces are entirely coated or covered with a copper-plate layer (not shown). These electrodes 111, 112 and 121, 122 and in-capacitor via conductors 131 and 132 are placed just below a substantially center portion of the IC chip 21. In the present embodiment, each thickness of the electrodes 111, 112 and 121, 122 is set to be greater than or equal to 20 μm and less than or equal to 40 μm.

For instance, when voltage is applied across the power supply internal electrode 141 and the ground internal electrode 142 through the electrodes 121 and 122 by energization from the motherboard side, electric charge (e.g. positive electric charge) accumulates in the power supply internal electrode 141 and electric charge (e.g. negative electric charge) accumulates in the ground internal electrode 142. As a consequence, the ceramic capacitor 101 functions as a capacitor. Further, in the ceramic capacitor 101, the power supply in-capacitor via conductor 131 and the ground in-capacitor via conductor 132 are arranged in alternating order with the both in-capacitor via conductors 131 and 132 being adjacent to each other. In addition, direction of current flow is set so that both directions of the current flowing in the power supply in-capacitor via conductor 131 and in the ground in-capacitor via conductor 132 are opposite to each other. With these arrangement and setting of the current flow direction, reduction of an inductance component can be achieved.

Figure 3:
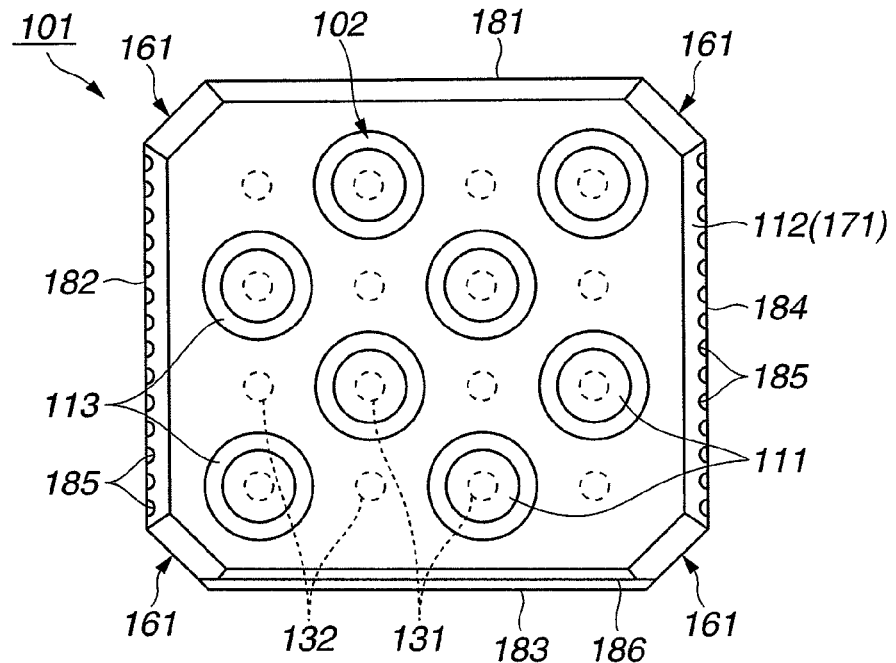
FIG. 3 is a schematic plan view showing a first capacitor main surface side of the ceramic capacitor.

As seen in FIGS. 2 and 3, on an outer surface of the ceramic sintered compact 104, a first metal layer 171 is provided. The first metal layer 171 covers all the corner portion 154 (the chamfer portion 162) also covers almost all the first capacitor main surface 102. That is, a length, in the thickness direction of the ceramic sintered compact 104, of the first metal layer 171 is almost equal to a thickness of the cover layer section 108. Further, the first power supply electrode 111 of the electrodes 111 and 112 on the first capacitor main surface 102 side is not covered with the first metal layer 171, but the first metal layer 171 unites with the first ground electrode 112. Thus the first metal layer 171 also functions as a conductor layer for ground (a ground conductor layer). More specifically, the first metal layer 171 (also the first ground electrode 112) is a plane (or flat) conductor that covers almost all the first capacitor main surface 102, and has a plurality of clearances 113 (circular open area patterns) for avoiding contact with the first power supply electrode 111. Here, the first power supply electrode 111 is a circular conductor formed on the first capacitor main surface 102, and its diameter is set to approx. 500 μm.

Figure 4:
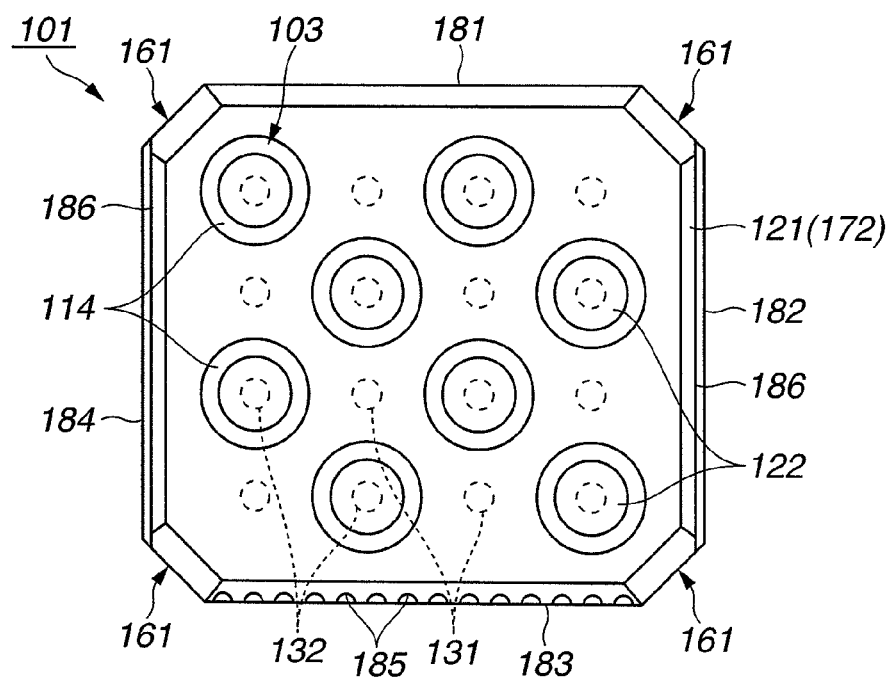
FIG. 4 is a schematic plan view showing a second capacitor main surface side of the ceramic capacitor.

In addition, as seen in FIGS. 2 and 4, on another outer surface of the ceramic sintered compact 104, a second metal layer 172 is provided. The second metal layer 172 covers all the corner portion 155 (the chamfer portion 163) also covers almost all the second capacitor main surface 103. That is, a length, in the thickness direction of the ceramic sintered compact 104, of the second metal layer 172 is almost equal to a thickness of the cover layer section 109. Further, the second ground electrode 122 of the electrodes 121 and 122 on the second capacitor main surface 103 side is not covered with the second metal layer 172, but the second metal layer 172 unites with the second power supply electrode 121. Thus the second metal layer 172 also functions as a conductor layer for power supply (a power supply conductor layer). More specifically, the second metal layer 172 (also the second power supply electrode 121) is a plane (or flat) conductor that covers almost all the second capacitor main surface 103, and has a plurality of clearances 114 (circular open area patterns) for avoiding contact with the second ground electrode 122. Here, the second ground electrode 122 is a circular conductor formed on the second capacitor main surface 103, and its diameter is set to approx. 500 μm.

As shown in FIG. 2, outer surfaces of the metal layers 171 and 172 which cover the corner portions 154 and 155 respectively have a curved surface. As explained in more detail below, a connection part 173 between the outer surface of the first metal layer 171 which covers the corner portion 154 (the chamfer portion 162) and the outer surface of the first metal layer 171 which covers the first capacitor main surface 102, is the curved surface (radius is approx. 0.05 mm). Likewise, a connection part 174 between the outer surface of the second metal layer 172 which covers the corner portion 155 (the chamfer portion 163) and the outer surface of the second metal layer 172 which covers the second capacitor main surface 103, is also the curved surface (radius is approx. 0.05 mm). With this, since stress concentration to the metal layers 171 and 172 can relax upon an occurrence of deformation of the filling material 92 due to temperature change, an effect of preventing an occurrence of crack in the filling material 92 can be expected.

The metal layers 171 and 172 are layers that are formed, with nickel being a principal component same as the electrodes 111, 112 and 121, 122, and their surfaces are coated or covered with a copper-plate layer (not shown). Each thickness of these metal layers 171 and 172 is greater than or equal to 5 μm and less than or equal to 40 μm (in the present embodiment, it is greater than or equal to 20 μm and less than or equal to 40 μm). The thickness of the metal layers 171 and 172 is thicker than that of the internal electrodes 141, 142, and is equal to that of the electrodes 111, 112 and 121, 122. Here, in the present embodiment, the thickness of the metal layers 171 and 172 is not a uniform thickness. As explained in more detail below, a thickness of the curved surface of the metal layers 171 and 172 is thinner than a thickness of non-curved surface of the metal layers 171 and 172. Further, a thickness of the metal layers 171 and 172 which respectively cover the chamfer portions 162 and 163 is equal to a thickness of the metal layers 171 and 172 which respectively cover the first and second capacitor main surfaces 102 and 103. However, the metal layers 171 and 172 which cover the chamfer portions 162 and 163 could be thicker than the metal layers 171 and 172 which cover the first and second capacitor main surfaces 102 and 103, or could be thinner than the metal layers 171 and 172 which cover the first and second capacitor main surfaces 102 and 103. Or, the thickness of the metal layers 171 and 172 could be uniform.

In the following, a method for manufacturing the ceramic capacitor 101 will be explained.

Figure 8:
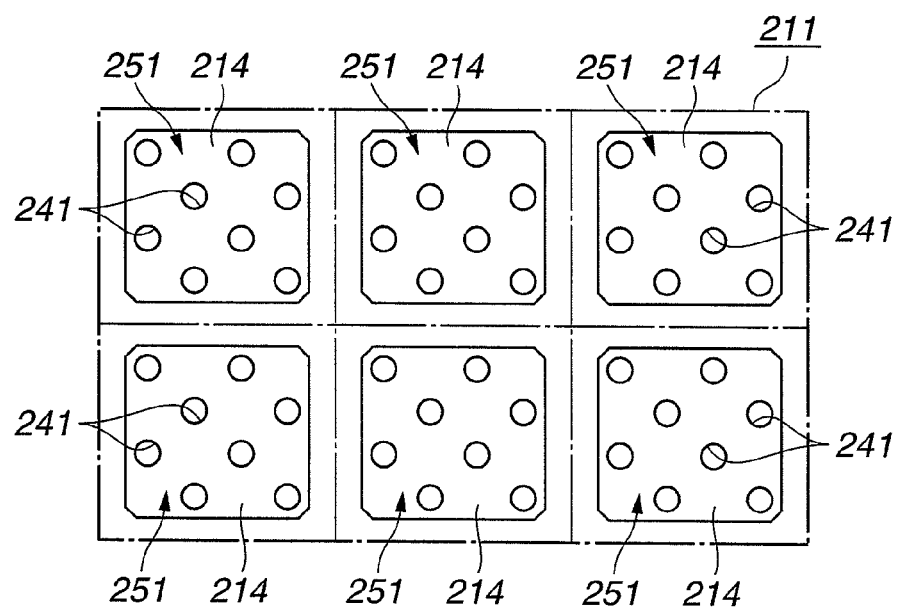
FIG. 8 is a schematic plan view showing a first green sheet.
Figure 9:
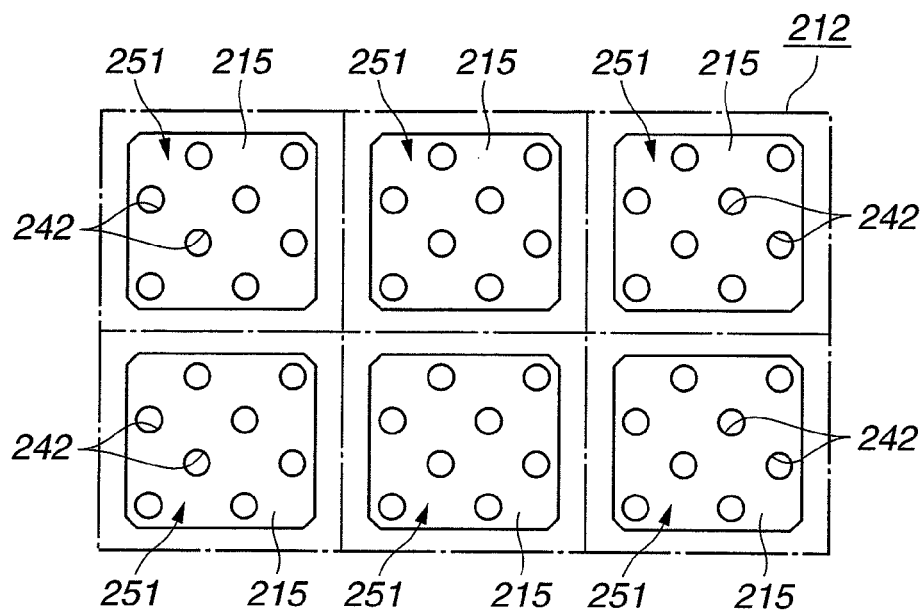
FIG. 9 is a schematic plan view showing a second green sheet.
Figure 10:
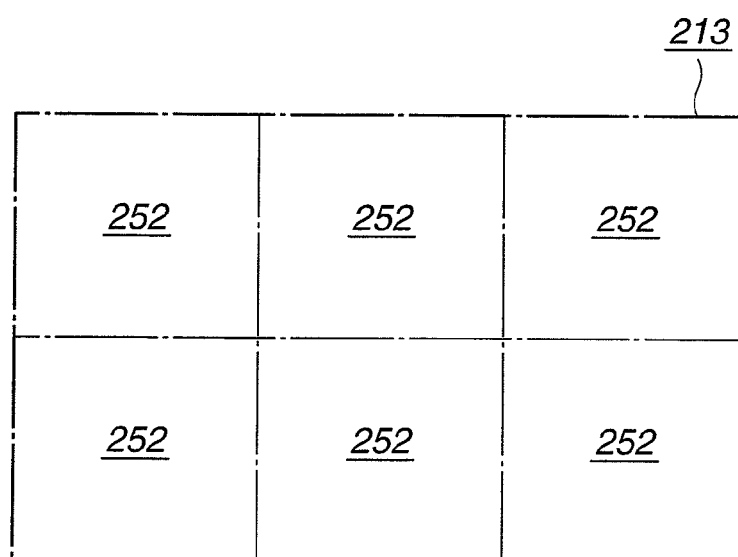
FIG. 10 is a schematic plan view showing a third green sheet.

First, a ceramic-made first green sheet 211 (see FIG. 8) and a ceramic-made second green sheet 212 (see FIG. 9), each of which has an approximately 7 μm thickness, are formed. Also a ceramic-made third green sheet 213 (see FIG. 10) whose thickness is approximately 30 μm is formed. Each green sheet 211, 212 is a multi-device-forming green sheet that has an arrangement in which a plurality of square product parts 251 (each of which becomes the ceramic dielectric layer 105) are arranged in longitudinal and lateral directions along the plane direction. The third green sheet 213 is a multi-device-forming green sheet that has an arrangement in which a plurality of square product parts 252 (each of which becomes the ceramic dielectric layer 153) are arranged in longitudinal and lateral directions along the plane direction.

Second, nickel paste for the internal electrode is applied in the product parts 251 and 252 through a screen printing and is dried. Through this process, a power supply internal electrode part 214 (see FIG. 8) that finally becomes the power supply internal electrode 141 is formed in the first green sheet 211, and an earth (or ground) internal electrode part 215 (see FIG. 9) that finally becomes the ground internal electrode 142 is formed in the second green sheet 212. In the power supply internal electrode part 214, a hole part 241 that becomes the clearance 143 (see FIG. 5) after a sintering (burning or firing) process is provided. In the ground internal electrode part 215, a hole part 242 that becomes the clearance 144 (see FIG. 6) after the sintering process is provided.

Figure 11:
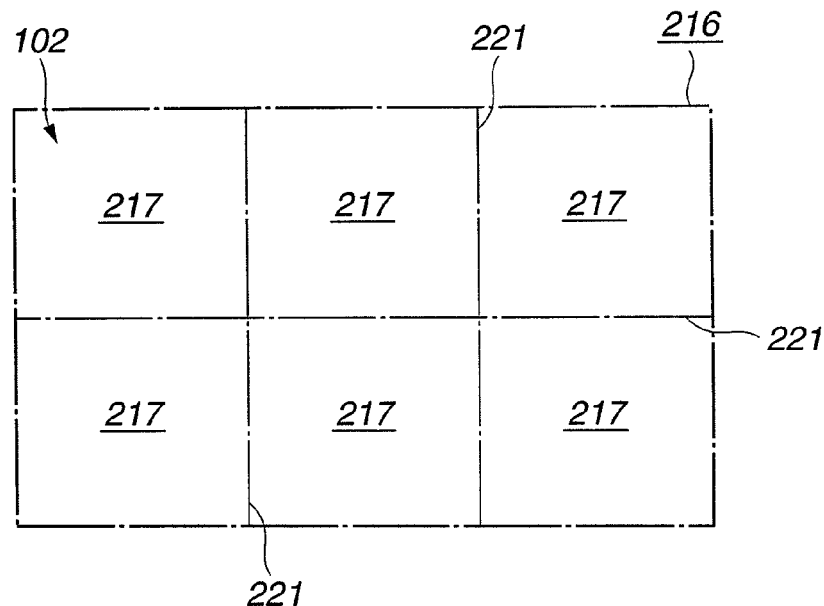
FIG. 11 is a drawing for explaining a method for manufacturing the ceramic capacitor.
Figure 12:
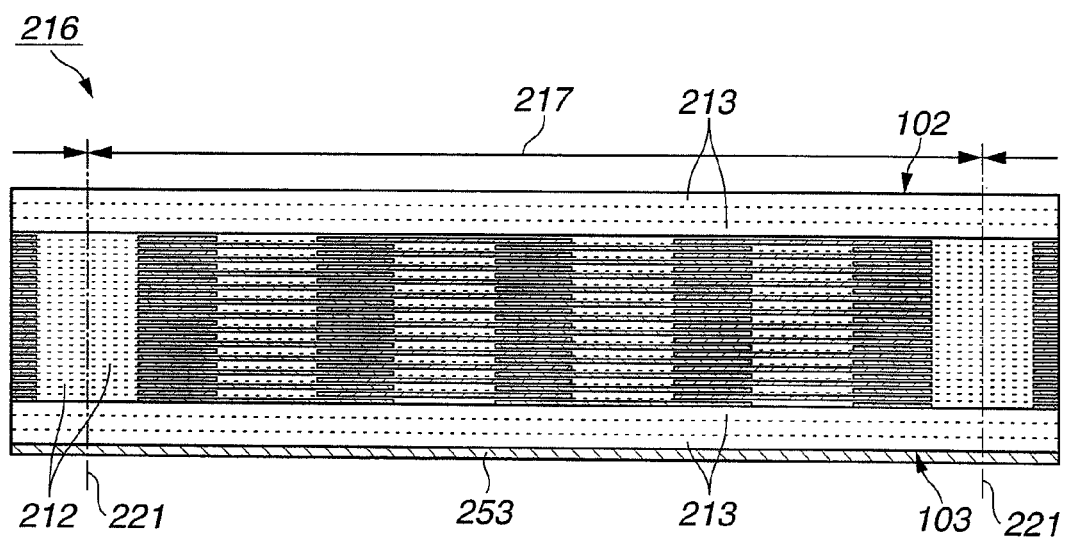
FIG. 12 is a drawing for explaining the method for manufacturing the ceramic capacitor.

In a subsequent laminating (or stacking) process, a plurality of the third green sheets 213 are layered on a supporting sheet 253 (see FIG. 12) that is made of a PET resin (polyethylene terephthalate resin) while keeping a temperature at 65° C. by heating, then this section finally becomes the lower side cover layer section 109. Next, on an upper surface of the uppermost third green sheet 213 (i.e. on an upper surface of the section that becomes the lower side cover layer section 109), the first green sheet 211 and the second green sheet 212 are alternately layered, then this section finally becomes the capacitor forming layer section 107. Further, on an upper surface side of the green sheets 211, 212 (i.e. on an upper surface of the section that becomes the capacitor forming layer section 107), a plurality of the third green sheets 213 are layered, then this section finally becomes the upper side cover layer section 108. As a consequence, the first to third green sheets 211~213 are layered and combined into one, then a multi-device-forming multilayer unit 216 in which a plurality of square product areas 217 (each of which becomes the ceramic capacitor 101) are arranged in longitudinal and lateral directions along the plane direction is provided (see FIGS. 11 and 12).

Figure 13:
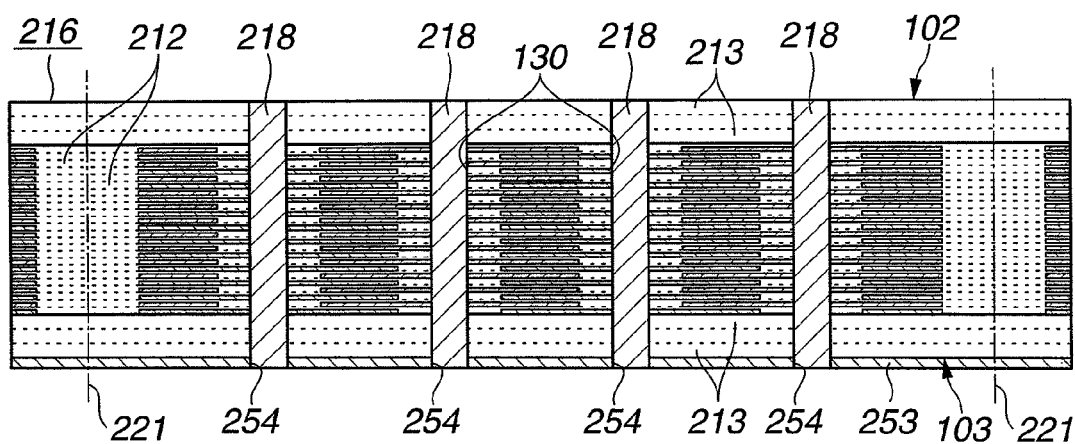
FIG. 13 is a drawing for explaining the method for manufacturing the ceramic capacitor.

In a subsequent hole forming (or punching) process, by a laser processing using a laser beam machine, a plurality of the via holes 130 are formed in the multi-device-forming multilayer unit 216 so as to penetrate the multi-device-forming multilayer unit 216, and also an opening 254 that communicates with the via hole 130 is formed in the supporting sheet 253 so as to penetrate the supporting sheet 253 (see FIG. 13).

In a subsequent conductor forming process, by using a paste pressing filling machine (not shown) etc., each via hole 130 is filled with via conductor nickel paste (via conductor forming material). In this process, the via conductor nickel paste fills not only the via hole 130 but the opening 254 as well. Through this process, a conductor section 218 (see FIG. 13) that finally becomes the in-capacitor via conductors 131, 132 is formed.

Figure 14:
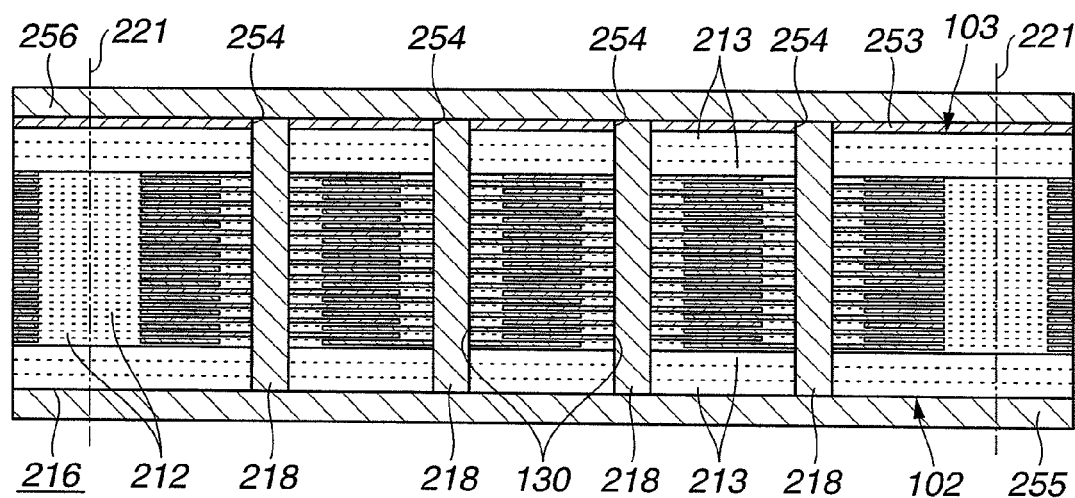
FIG. 14 is a drawing for explaining the method for manufacturing the ceramic capacitor.

Next, a rubber sheet 255 of thickness 0.1 mm, which is made of silicon rubber (or silicon gum), is set on a flat drag (not shown) (see FIG. 14). Then a multilayer unit that is formed from the multi-device-forming multilayer unit 216 and the supporting sheet 253 is put on the rubber sheet 255 with an upper surface (the first capacitor main surface 102) of the multi-device-forming multilayer unit 216 facing downwards. Afterwards, a rubber sheet 256 of thickness 0.1 mm, made of silicon rubber (or silicon gum), is set on the supporting sheet 253, and a cope (not shown) is set on the rubber sheet 256. Subsequently, a pressing force (1000 kg/cm2) in a stacking direction is applied between the cope and the drag while keeping the temperature at 80° C. by heating (a high pressure pressing process). As a consequence, the first to third green sheets 211~213 strongly unite with each other.

Here, with respect to the multi-device-forming multilayer unit 216, there are overlapping area and non-overlapping area where the power supply internal electrode part 214 and the ground internal electrode part 215 overlap and do not overlap with each other in the thickness direction. Because of this, steps (electrode steps) appear on the upper surface and a lower surface of the multi-device-forming multilayer unit 216. Therefore, in the present embodiment, the upper surface of the multi-device-forming multilayer unit 216 is contiguous with (or touches) the rubber sheet 255 that is a soft material, and thus the rubber sheet 255 fits the electrode steps by its elastic deformation (the rubber sheet 255 is elastically deformed and follows or agrees with the electrode steps).

Figure 15:
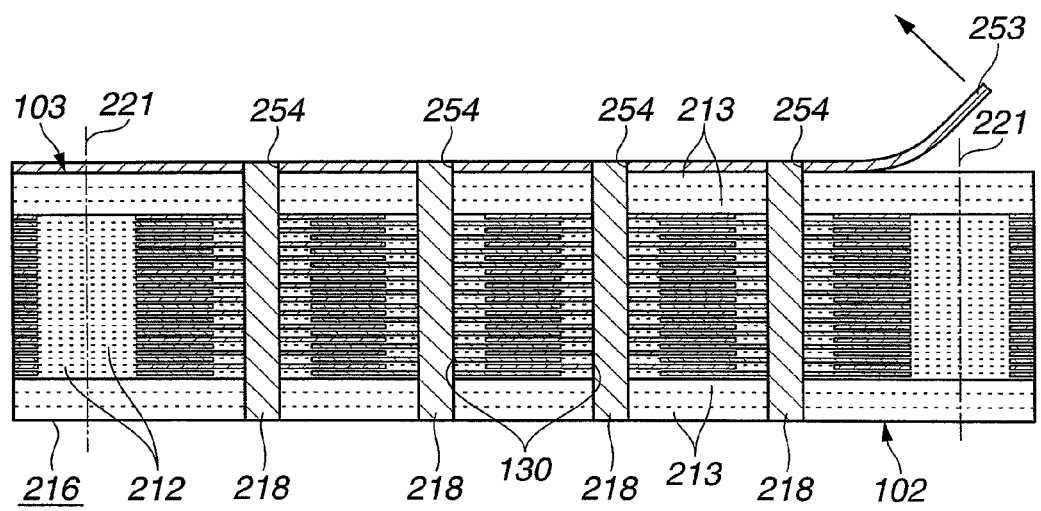
FIG. 15 is a drawing for explaining the method for manufacturing the ceramic capacitor.
Figure 16:
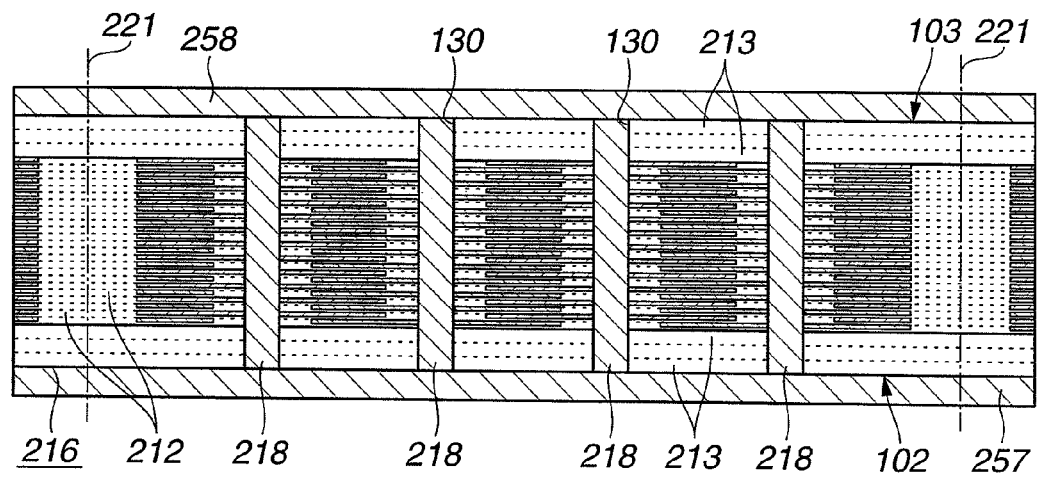
FIG. 16 is a drawing for explaining the method for manufacturing the ceramic capacitor.

In an exfoliation process that takes place after the high pressure pressing process, the supporting sheet 253 is peeled or removed from the multi-device-forming multilayer unit 216 (see FIG. 15). Next, a metal plate 257 is set on a flat lower jig (not shown), and the multi-device-forming multilayer unit 216 is put on the metal plate 257 (see FIG. 16). Further, a metal plate 258 is set on the multi-device-forming multilayer unit 216, and an upper jig (not shown) is set on the metal plate 258. Subsequently, a pressing force (200 kg/cm2) in the stacking direction is applied between the upper and lower jigs while keeping the temperature at 80° C. by heating (a surface pressing process). Through this process, in a case where the conductor section 218 protrudes from the second capacitor main surface 103 (also the first capacitor main surface 102) of the multi-device-forming multilayer unit 216, its protruding part is pressed and crushed. As a consequence, a height of an end surface of the conductor section 218 becomes equal to that of the second capacitor main surface 103 (also the first capacitor main surface 102).

Figure 17:
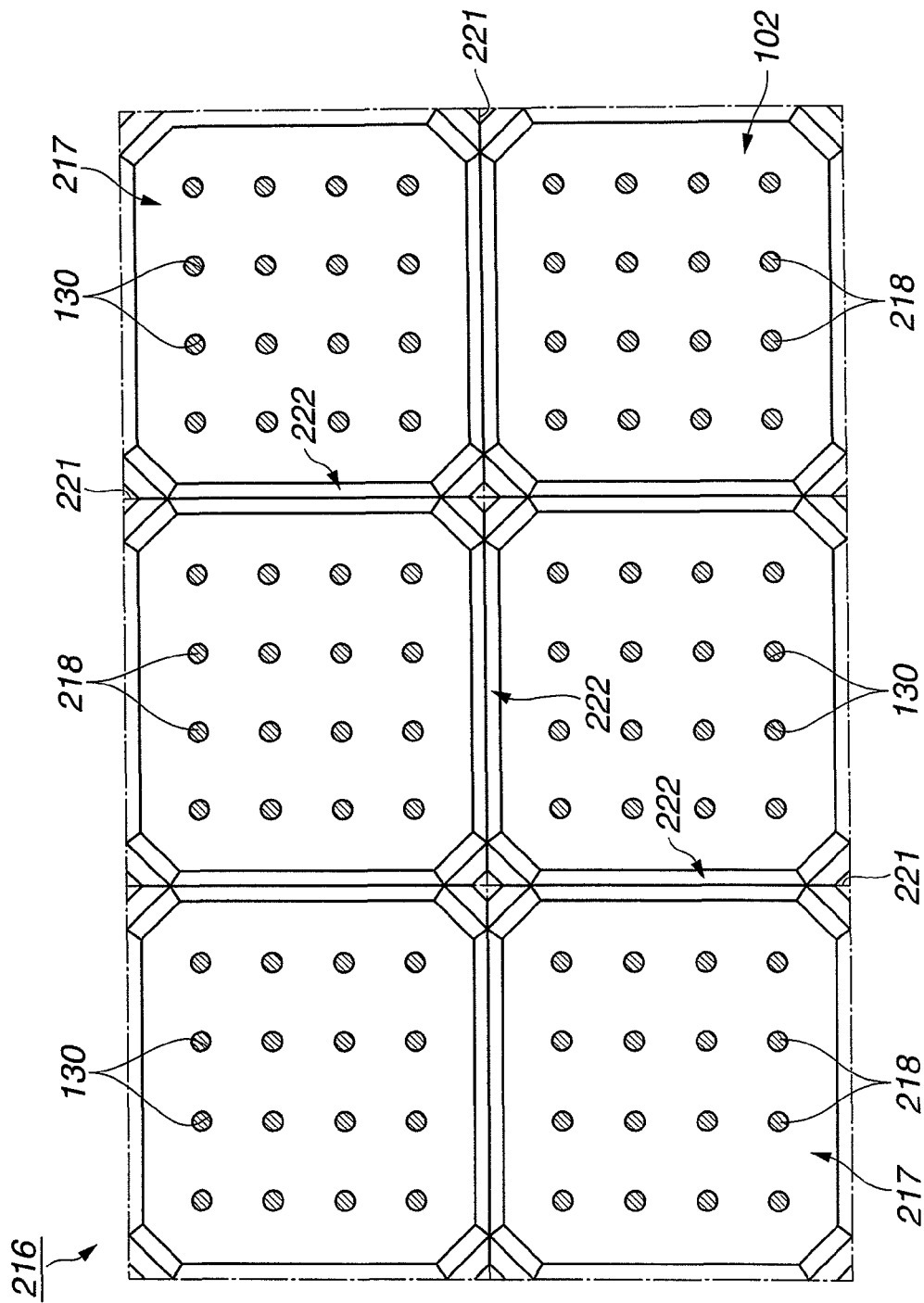
FIG. 17 is a drawing for explaining the method for manufacturing the ceramic capacitor.
Figure 18:
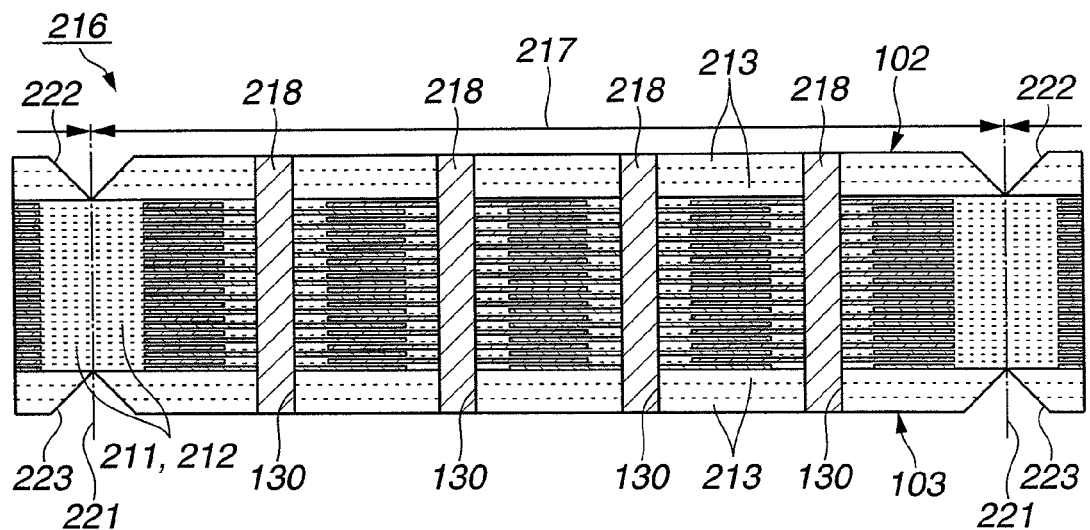
FIG. 18 is a drawing for explaining the method for manufacturing the ceramic capacitor.
Figure 19:
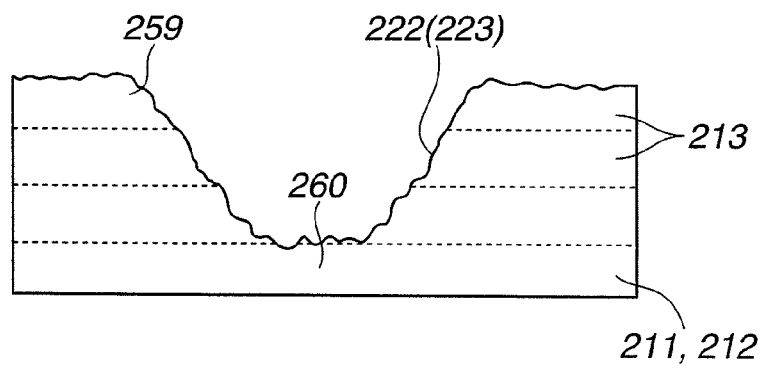
FIG. 19 is an enlarged sectional view showing a groove portion.

In a subsequent groove portion forming process, a laser processing is performed along an outline 221 of the product area 217. Through this process, a groove portion 222 that opens on the upper surface (the first capacitor main surface 102) of the multi-device-forming multilayer unit 216 and a groove portion 223 that opens on the lower surface (the second capacitor main surface 103) of the multi-device-forming multilayer unit 216, are formed (see FIGS. 17 and 18). Regarding these groove portions 222 and 223, as shown in FIG. 19, a width of an opening portion 259 is set to 300 µm, a width of a bottom portion 260 is set to 100 µm, and a depth is set to 100 µm, then the groove portions 222 and 223 have an inverted trapezoidal shape in cross section. The groove portion 222 is a groove portion for forming the chamfer portion 162 at the boundary portion between the first capacitor main surface 102 and each capacitor side surface 181~184. The groove portion 223 is a groove portion for forming the chamfer portion 163 at the boundary portion between the second capacitor main surface 103 and each capacitor side surface 181~184. Here, one of laser conditions to form the groove portions 222, 223 is a beam diameter of the laser with which the multi-device-forming multilayer unit 216 is radiated. For example, it is preferable that the laser beam diameter be 100 µm or more.

Figure 20:
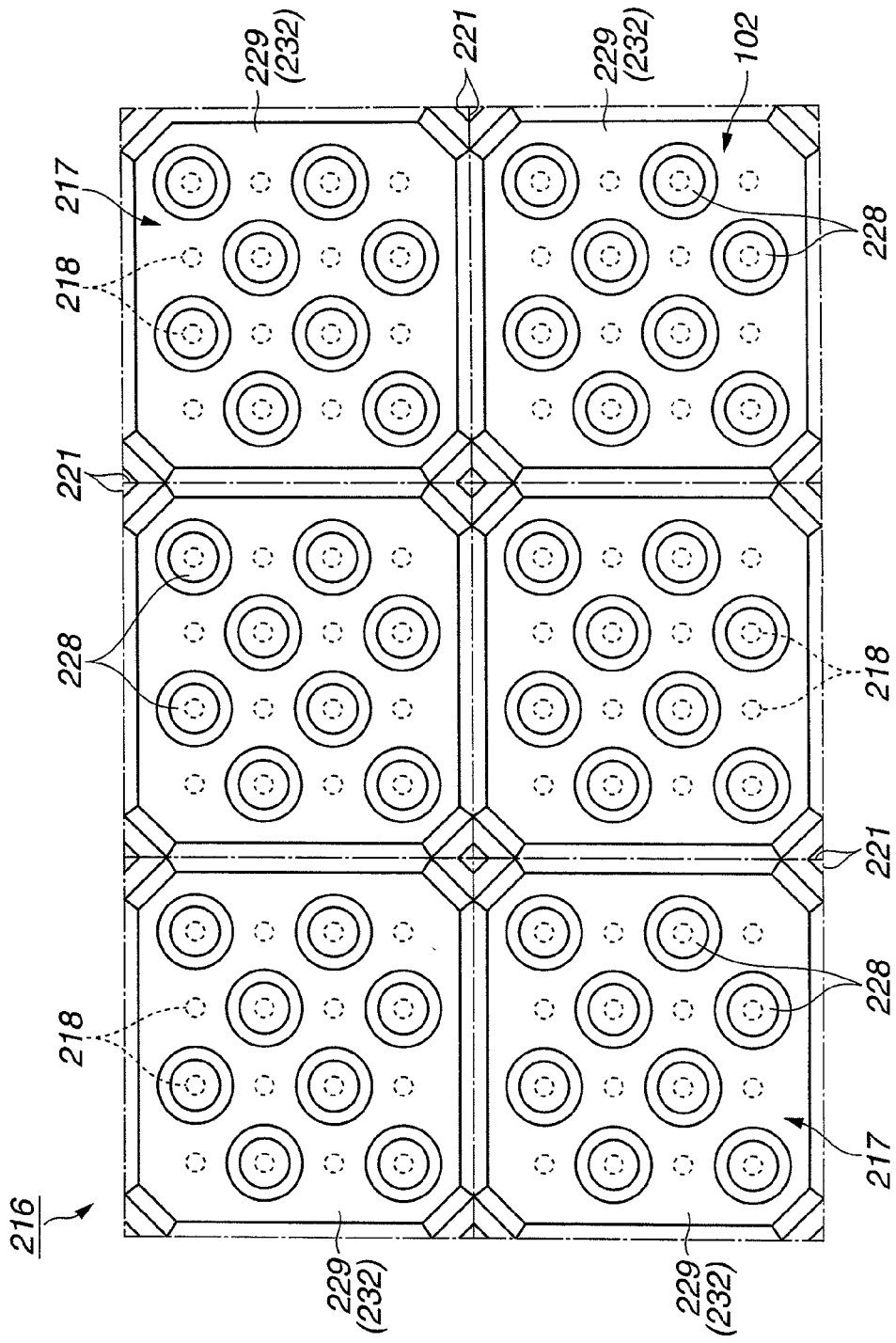
FIG. 20 is a drawing for explaining the method for manufacturing the ceramic capacitor.
Figure 21:
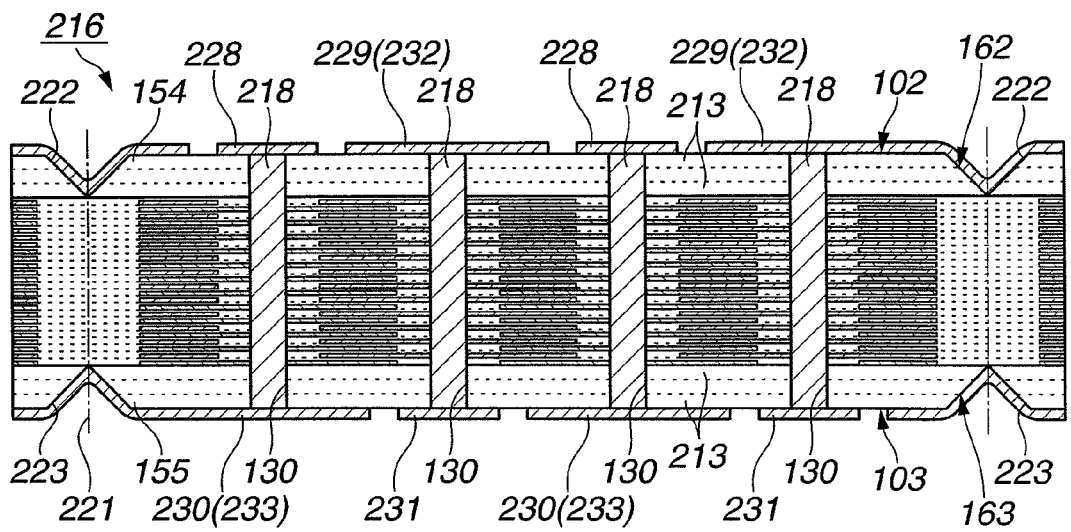
FIG. 21 is a drawing for explaining the method for manufacturing the ceramic capacitor.

In subsequent surface layer electrode part forming process and metal layer part coating (or covering) process, nickel paste is applied on the upper surface (the first capacitor main surface 102) of the multi-device-forming multilayer unit 216 through printing, and a first surface layer electrode part 228 that finally becomes the first power supply electrode 111 is formed so as to cover the upper end surface of the conductor section 218 (see FIGS. 20 and 21). At the same time, nickel paste is applied on the upper surface and the chamfer portion 162 (the corner portion 154) of the multi-device-forming multilayer unit 216 through printing, and a first surface layer electrode part 229 (a first metal layer part 232 that finally becomes the first metal layer 171) which finally becomes the first ground electrode 112 is formed so as to cover the upper end surface of the conductor section 218 and the corner portion 154 (see FIGS. 20 and 21). That is, the metal layer part covering process is performed simultaneously with the surface layer electrode part forming process.

Furthermore, nickel paste is applied on the lower surface (the second capacitor main surface 103) and the chamfer portion 163 (the corner portion 155) of the multi-device-forming multilayer unit 216 through printing, and a second surface layer electrode part 230 (a second metal layer part 233 that finally becomes the second metal layer 172) which finally becomes the second power supply electrode 121 is formed so as to cover the lower end surface of the conductor section 218 and the corner portion 155 (see FIG. 21). At the same time, nickel paste is applied on the lower surface of the multi-device-forming multilayer unit 216 through printing, and a second surface layer electrode part 231 that finally becomes the second ground electrode 122 is formed so as to cover the lower end surface of the conductor section 218 (see FIG. 21). Subsequently, the surface layer electrode parts 228~231 are dried then solidified to some extent.

Figure 22:
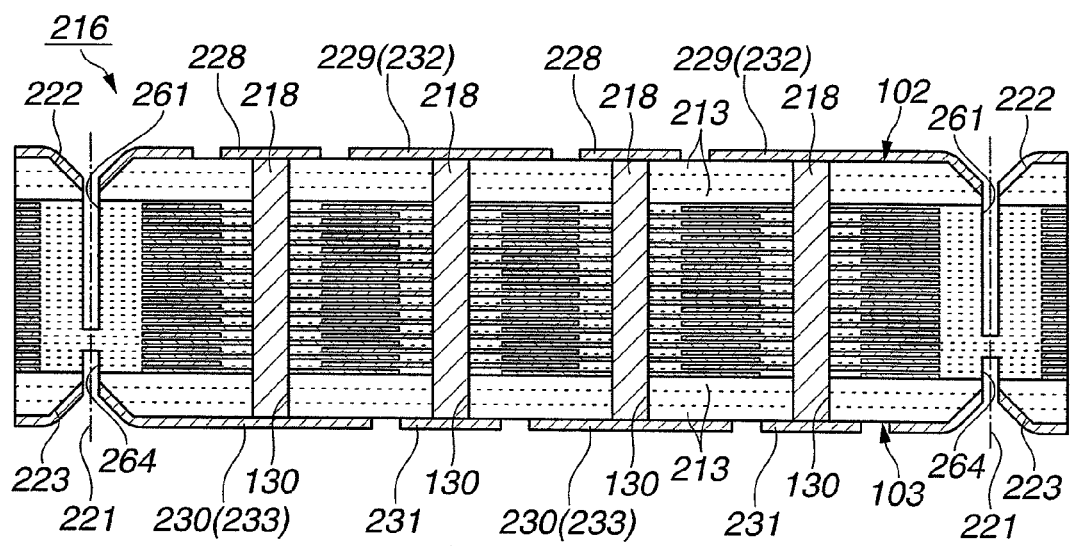
FIG. 22 is a drawing for explaining the method for manufacturing the ceramic capacitor.
Figure 23:
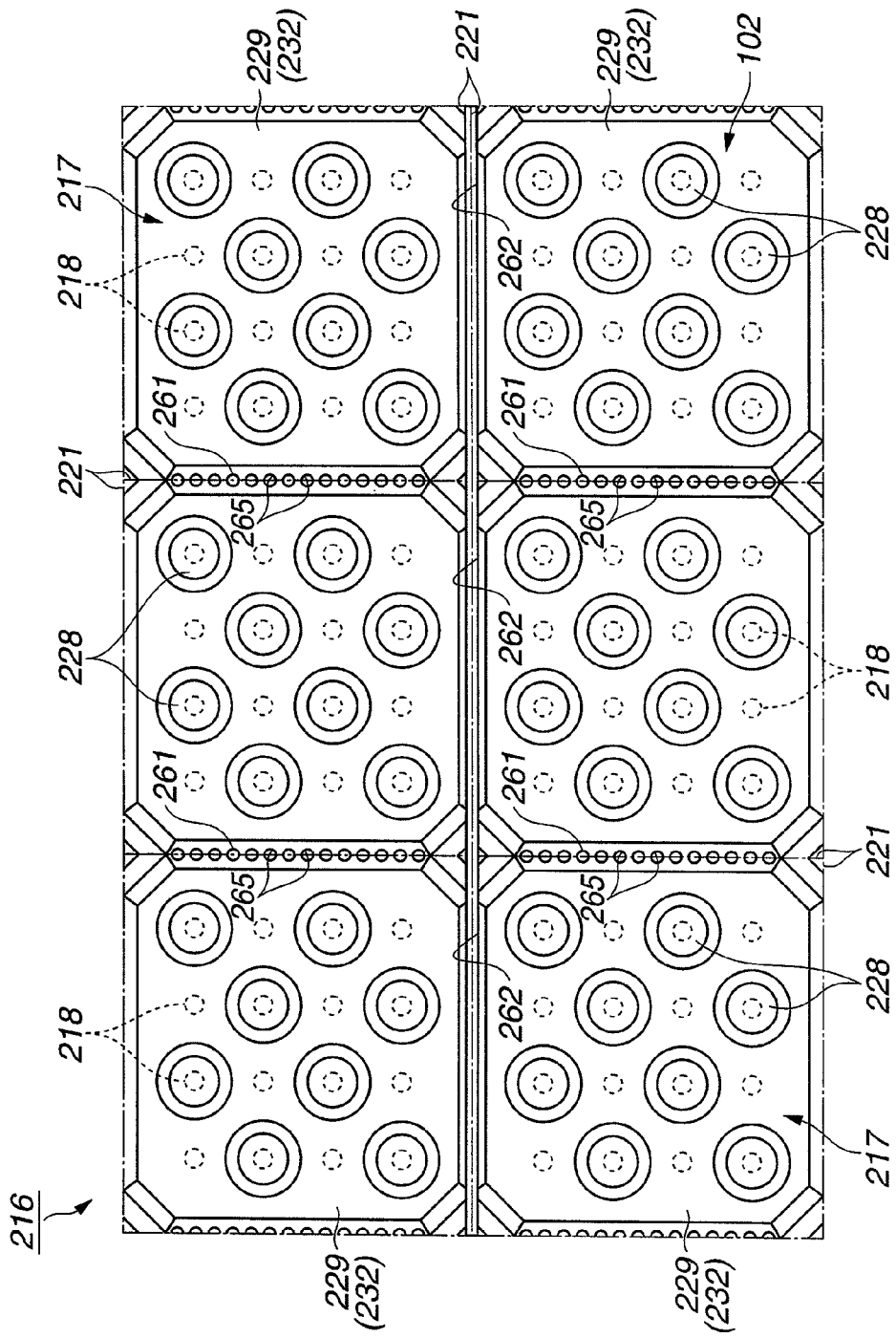
FIG. 23 is a drawing for explaining the method for manufacturing the ceramic capacitor.

In a subsequent grooving process, a laser processing is performed to the bottom portion 260 (see FIG. 19) of the groove portion 222. Through this process, a break groove 261 that finally becomes the concave portion 185 and a break groove 262 that finally becomes the concave portion 186, are formed (see FIGS. 22 and 23). The break groove 261 opens at the bottom portion 260 of the groove portion 222 and is arranged along the outline 221 of the product area 217, and forms perforations. More specifically, the break groove 261 is formed by a plurality of hole sections 265 (see FIG. 23) that are discontinuously arranged along the outline 221. On the other hand, the break groove 262 opens at the bottom portion 260 of the groove portion 222 and is arranged along the outline 221, and forms a slit.

Further, in the grooving process, the laser processing is performed also to the bottom portion 260 of the groove portion 223. Through this process, a break groove (not shown) that finally becomes the concave portion 185 and a break groove 264 that finally becomes the concave portion 186, are formed (see FIG. 22). The break groove (not shown) opens at the bottom portion 260 of the groove portion 223 and is arranged along the outline 221, and forms perforations. More specifically, the break groove (not shown) is formed by a plurality of hole sections (not shown) that are discontinuously arranged along the outline 221. On the other hand, the break groove 264 opens at the bottom portion 260 of the groove portion 223 and is arranged along the outline 221, and forms a slit. In the present embodiment, on a back side of the break groove 261 forming the perforations, the break groove 264 forming the slit is positioned. On a back side of the break groove 262 forming the slit, the break groove (not shown) forming the perforations is positioned.

Figure 24:
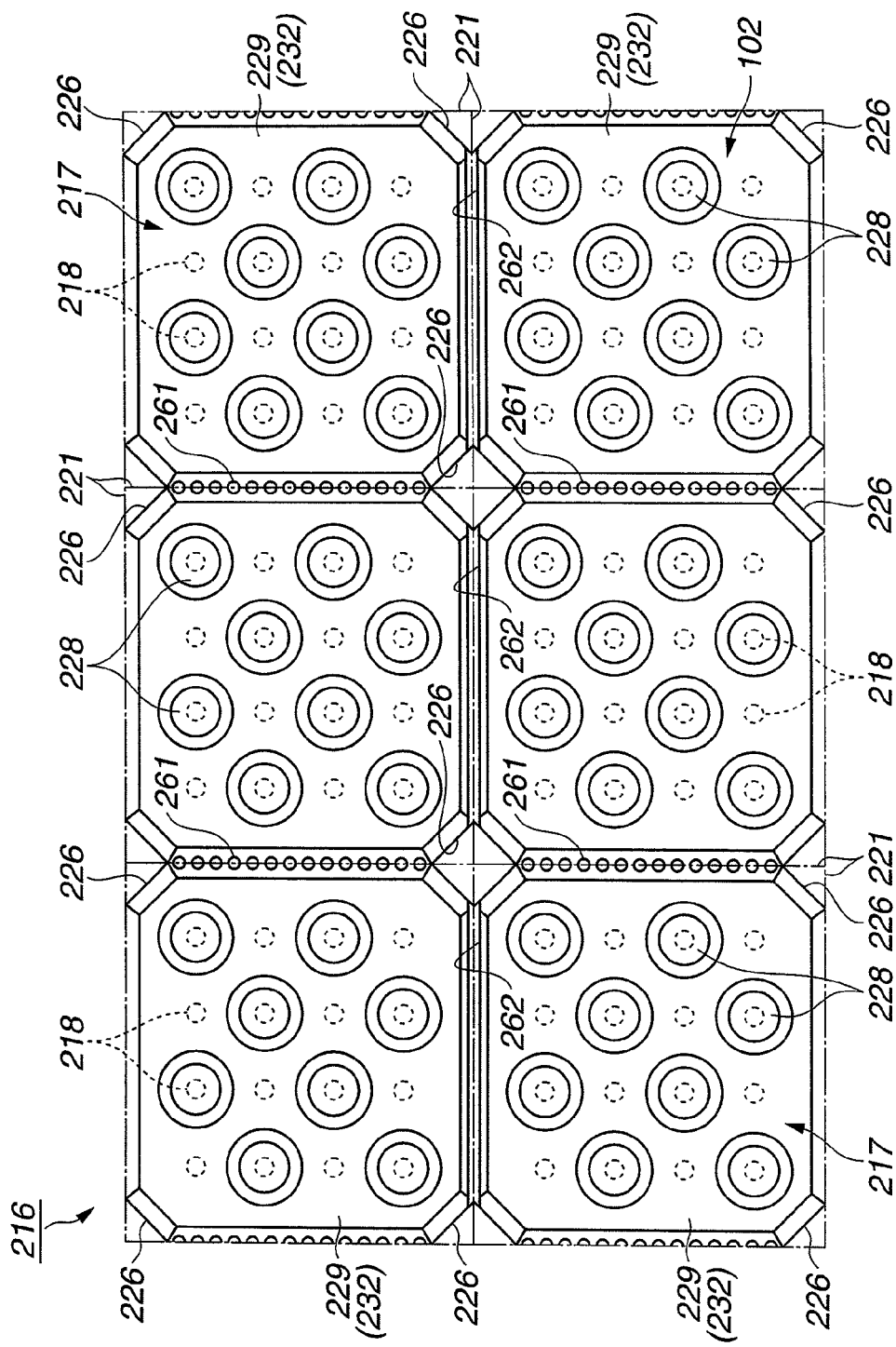
FIG. 24 is a drawing for explaining the method for manufacturing the ceramic capacitor.

In a subsequent penetration hole forming process, by performing a laser processing to a crossing area between longitudinal and lateral outlines 221 of the product area 217 (i.e. a corner area of the product area 217), a penetration hole 226 is formed (see FIG. 24). The penetration hole 226 is a hole for forming the side chamfer portion 161 at the boundary portion between adjacent two capacitor side surfaces in the ceramic capacitor 101.

In a subsequent sintering (burning or firing) process, the multi-device-forming multilayer unit 216 on which each surface layer electrode part 228~231 is formed is degreased, and the sintering is further performed for a certain time in an oxidative atmosphere. A sintering temperature at this time is set to 1300° C. that is a temperature at which barium titanate can be sintered. As a consequence, barium titanate in each green sheet 211~213 is sintered, and the ceramic sintered compact 104 is obtained. At the same time, nickel in each internal electrode part 214, 215 is sintered, and thus forming the internal electrodes 141, 142. Also nickel in each surface layer electrode part 228~231 is sintered, and thus forming the electrodes 111, 112 and 121, 122. Furthermore, nickel in the via conductor nickel paste is sintered, and thus forming the in-capacitor via conductors 131, 132.

Next, each of the electrodes 111, 112 and 121, 122 (the metal layers 171 and 172) which the ceramic sintered compact 104 obtained has, is plated with copper through electroless plating (a thickness is approx. 10 μm). Through this plating, the above-mentioned copper-plate layer is formed on each of the electrodes 111, 112 and 121, 122 (the metal layers 171 and 172).

In a subsequent dividing process, the multi-device-forming multilayer unit 216 is cut along the groove portions 222, 223 (more specifically, along the break grooves 261, 262 and 264). Through this dividing process, the product areas 217 are divided into each product area 217, and a plurality of pieces of the ceramic capacitor 101 are obtained (see FIG. 2).

When installing this ceramic capacitor 101 in the wiring substrate 10, as a preparation for the installation, the core substrate 11 provided with the installation opening part 91 is formed first by a common method. The ceramic capacitor 101 is then installed in the installation opening part 91 of the core substrate 11, and the gap between the inner surface of the installation opening part 91 and the capacitor side surfaces 181~184 of the ceramic capacitor 101 is filled with the thermosetting resin filling material 92. Subsequently, when performing a heating process, the filling material 92 is cured, then the ceramic capacitor 101 is fixed or secured inside the installation opening part 91.

Further, on the basis of a common method, the main surface side build-up layer 31 is formed on the core main surface 12 of the core substrate 11 and the first capacitor main surface 102 of the ceramic capacitor 101. Also the back surface side build-up layer 32 is formed on the core back surface 13 of the core substrate 11 and the second capacitor main surface 103 of the ceramic capacitor 101. Consequently, the wiring substrate 10 formed from the core substrate 11 and the build-up layers 31 and 32 is completed.

In view of the foregoing, according to the present embodiment, the following effects are obtained.

(1) In the method for manufacturing the ceramic capacitor 101 in the present embodiment, the groove portions 222 and 223 that become the chamfer portions 162 and 163 are formed in the groove portion forming process before the sintering process. Further, the break grooves 261, 262 and 264 are formed in the grooving process prior to the sintering process. Moreover, the penetration hole 226 that becomes the side chamfer portion 161 is formed in the penetration hole forming process prior to the sintering process. That is to say, the green sheets 211~213, which are softer and are treated more easily than the ceramic dielectric layers 105, 153, are processed or treated for forming the groove portions 222 and 223, the break grooves 261, 262 and 264 and the penetration hole 226. With this, it is possible to form the chamfer portions 162 and 163, the break grooves 261, 262 and 264 and the penetration hole 226 in a short time and at a low cost, which means that the ceramic capacitor 101 can be formed in a short time and at a low cost.

(2) In the related art technique in Patent Document 2, because the chamfer portion is formed through the barrel finishing process after the sintering process, accuracy of dimensions is decreased, and there is a possibility that the yield will be reduced due to an occurrence of appearance defect (poor appearance) such as chipping. Thus, in the present embodiment, by performing the laser processing, the chamfer portions 162 and 163 and the side chamfer portion 161 are formed. Hence, these chamfer portions 162 and 163 and side chamfer portion 161 can be formed accurately. In addition, since there is less occurrence of particles during the process, the appearance defect can be prevented, and this gives rise to increase in yield.

(3) Further, in the related art technique in Patent Document 2, because the surface layer electrode is removed simultaneously with the forming of the chamfer portion, a brittle ceramic dielectric layer is exposed and appears at the corner portion of the ceramic capacitor. In this case, the stress concentrates at the corner portion upon installation of the ceramic capacitor in the wiring substrate, and therefore the crack easily appears and develops or spreads at an outer periphery of the ceramic capacitor 101. This causes reduction of the yield. Thus, in the present embodiment, the brittle ceramic dielectric layer 153 at the corner portions 154 and 155 are covered with the metal layers 171 and 172. Toughness or tenacity of the ceramic sintered compact 104 is therefore increased. Accordingly, even if an external stress concentrates at the corner portions 154 and 155 upon the installation in the wiring substrate 10, the occurrence of the crack whose starting point is an outer peripheral surface of the ceramic capacitor 101 can be suppressed. This results in increase in yield.

(4) In the present embodiment, the first metal layer 171 covers not only the chamfer portion 162 (the corner portion 154) but also the first capacitor main surface 102. Likewise, the second metal layer 172 covers not only the chamfer portion 163 (the corner portion 155) but also the second capacitor main surface 103. Each contact area between the metal layers 171, 172 and the resin interlayer insulation layers 33, 34 consequently becomes large, and an adhesion strength between the ceramic capacitor 101 and the resin interlayer insulation layers 33, 34 increases. In addition, flatness or evenness of the surface of the build-up layers 31, 32 is improved, and this facilitates the mounting of the IC chip 21. From the foregoing, occurrences of lift and delamination of the build-up layers 31, 32, caused by the thermal expansion, can be prevented, high reliability can therefore be gained.

(5) In the present embodiment, the metal layers 171, 172 and the electrodes 121, 122 are formed at the same time. In other words, there is no need to form the metal layers 171, 172 separately from the electrodes 121, 122, i.e. another process for forming only the metal layers 171, 172 is not required. It is therefore possible to reduce the number of the processes, namely that the manufacturing process of the ceramic capacitor 101 becomes easier. Further, since areas of the ground conductor layer and the power supply conductor layer become large, resistance can be lowered.

(6) In the ceramic sintered compact 104 in the present embodiment, every angle between the adjacent two surfaces is the obtuse angle. Thus, there is no stress concentration-prone part on the outer surface of the ceramic sintered compact 104, and this further reduces a tendency for the crack to appear in the filling material 92. The reliability of the wiring substrate 10 is further improved.

(7) For example, it might be possible that after dividing the multi-device-forming multilayer unit 216 into a plurality of multilayer units, these multilayer units are sintered individually in the sintering process. In this case, however, there is a possibility that an amount of warpage of the ceramic capacitor 101 after the sintering will be increased. Thus, in the present embodiment, the multi-device-forming multilayer unit 216 is sintered as it is in the sintering process. The amount of warpage of the ceramic capacitor 101 after the sintering can therefore be decreased. With this, the ceramic capacitor 101 can be readily embedded in or built into the wiring substrate 10.

(8) In the present embodiment, since the concave portions 185 and 186 are formed at the capacitor side surfaces 182~184 of the ceramic capacitor 101, when installing the ceramic capacitor 101 into the wiring substrate 10, the filling material 92 touching the outer surface of the ceramic sintered compact 104 easily goes into the insides of the concave portions 185 and 186. As a result, a bonding or junction strength between the ceramic capacitor 101 and the filling material 92 increases, and this results in further increase in the reliability of the wiring substrate 10.

(9) In the present embodiment, the ceramic capacitor 101 is placed just below the IC chip 21 that is mounted on the IC chip mounting area 23. Thus a length of a wire that connects the ceramic capacitor 101 and the IC chip 21 becomes short, then an increase in the inductance component of the wire can be prevented. As a consequence, reduction of the switching noises of the IC chip 21 by the ceramic capacitor 101 can be ensured, and also stabilization of the power supply voltage can be achieved. Moreover, since noise infiltration between the IC chip 21 and the ceramic capacitor 101 can be suppressed to an extremely small level, high reliability can be obtained without an occurrence of failure such as malfunction.

(10) In the present embodiment, since the IC chip mounting area 23 is placed in the area just above the ceramic capacitor 101, the IC chip 21 mounted on the IC chip mounting area 23 is supported by the ceramic capacitor 101 that has high rigidity and low thermal expansion coefficient. Hence, deformation of the main surface side build-up layer 31 at the IC chip mounting area 23 does not easily occur, and the IC chip 21 mounted on the IC chip mounting area 23 can be supported with stability. Therefore, this allows a large IC chip of size 10 mm square or larger which is sensitive to thermal stress because of high heat value or a low-k (low dielectric constant) IC chip to be used as the IC chip 21.

The present embodiment can be changed or modified as follows.

In the present embodiment, the groove portion forming process is performed after the conductor forming process. However, the process order of this groove portion forming process could be changed. For instance, the groove portion forming process could be performed after the laminating process and before the hole forming process, or may be performed after the hole forming process and before the conductor forming process.

In the groove portion forming process in the present embodiment, the groove portion 222 for forming the chamfer portion 162 is formed, and also the groove portion 223 for forming the chamfer portion 163 is formed. However, it could be possible that one of the groove portions 222 and 223 is not formed in the groove portion forming process.

Although the chamfer portions 162 and 163 and the side chamfer portion 161 in the present embodiment are the flat shaped chamfer portions, they could be curved chamfer portions. With this curved chamfer portion, since a corner or angle is not present in the chamfer portion, relaxation of the stress concentration is ensured. However, because it is difficult to remarkably accurately form the curved chamfer portion, the flat shaped chamfer portion is preferable.

In the grooving process in the present embodiment, the break grooves 261, 262 and 264 and the break groove (not shown) are formed only at portions which subsequently become the capacitor side surfaces 182~184. However, the break grooves 261, 262 and 264 and the break groove (not shown) could be formed at a portion that subsequently becomes the first capacitor side surface 181

In the present embodiment, the first metal layer 171 unites with the first ground electrode 112, and the second metal layer 172 unites with the second power supply electrode 121. However, the first metal layer 171 could be formed as a separate object from the first ground electrode 112, and the second metal layer 172 could be formed as a separate object from the second power supply electrode 121. In this case, the metal layers 171 and 172 could cover only the corner portions 154 and 155 respectively. Or, the metal layers 171 and 172 could be arranged while avoiding all the electrodes 111, 112 and 121, 122 and cover the capacitor main surfaces 102 and 103 respectively in addition to the corner portions 154 and 155.

In the ceramic capacitor 101 in the present embodiment, the cover layer section 108 is provided on the first capacitor main surface 102 side of the ceramic sintered compact 104, and the cover layer section 109 is provided on the second capacitor main surface 103 side of the ceramic sintered compact 104. However, the cover layer sections 108, 109 could be provided on the first capacitor main surface 102 side or on the second capacitor main surface 103 side, or no cover layer section might be provided on the both capacitor main surfaces 102 and 103.

Figure 25:
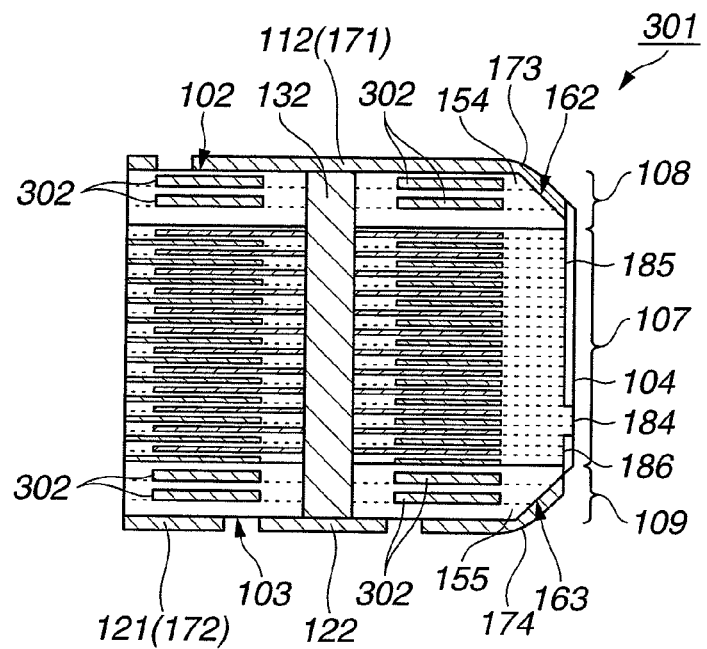
FIG. 25 is a sectional view of a main part, showing a ceramic capacitor of another embodiment.

Each of the cover layer sections 108, 109 in the present embodiment has the structure in which only a plurality of the ceramic dielectric layers 153 are layered. However, as shown by a ceramic capacitor 301 in FIG. 25, each of the cover layer sections 108, 109 could have a structure in which a plurality of the ceramic dielectric layers 153 (ceramic dielectric layers 154 and 155 in FIG. 25) and a dummy electrode 302 that is not electrically connected to the in-capacitor via conductors 131, 132 are alternately layered. Here, as the dummy electrode 302, an electrode having a large area is preferable. For example, it could be a plane (or flat) conductor pattern that is arranged with a plurality of clearances provided around the in-capacitor via conductors 131, 132. By employing such structure, toughness or tenacity of the ceramic sintered compact 104 at the cover layer sections 108, 109 can be increased by both of the metal layers 171, 172 and the dummy electrode 302. With this, the occurrence of the crack at an outer periphery of the cover layer sections 108, 109 can be surely suppressed.

In the wiring substrate 10 in the present embodiment, the ceramic capacitor 101 is installed in the installation opening part 91 opening at the core main surface 12 and the core back surface 13 of the core substrate 11. However, this installation is not limited. For instance, instead of the installation opening part 91, an installation opening part (e.g. a non-penetration hole) which has a recessed part of a closed-bottom and opens only at the core main surface 12 of the core substrate 11 is formed, then the ceramic capacitor 101 could be installed in this non-penetration hole.

In the present embodiment, the ceramic capacitor 101 is embedded in the core substrate 11. However, a ceramic capacitor (e.g. its thickness is 0.08 mm) that is thinner than the ceramic capacitor 101 is formed, then this ceramic capacitor could be embedded, for example, in the main surface side build-up layer 31.

In this case, a resin sheet (un-cured resin interlayer insulation layer 33) is layered (or laminated) on the core main surface 12 of the core substrate 11, then before the resin sheet is solidified (cured), the ceramic capacitor is set on the resin sheet using a mounting device (e.g. a mounting device made by Yamaha Motor Co., Ltd.). More specifically, the ceramic capacitor is set so that a part of the ceramic capacitor (i.e. the electrodes 121 and 122 on the second capacitor main surface 103 side) sinks into the resin sheet while pressurizing. With this setting, positioning of the ceramic capacitor is secured. Afterwards the resin sheet is cured then the resin interlayer insulation layer 33 is formed. And the resin interlayer insulation layer 35 and the conductor layer 42 are alternately formed, the main surface side build-up layer 31 is therefore completed.

By employing such configuration, as compared with the configuration in which the ceramic capacitor is installed inside the core substrate 11, a connecting pass (a capacitor connection wire) that electrically connects the IC chip 21 and the ceramic capacitor becomes short. With this, since an increase in the inductance component of the wire is prevented, reduction of the switching noises of the IC chip 21 by the ceramic capacitor can be ensured, and also stabilization of the power supply voltage can be achieved. Moreover, since noise infiltration between the IC chip 21 and the ceramic capacitor can be suppressed to an extremely small level, high reliability can be obtained without an occurrence of failure such as malfunction.

In the present embodiment, although BGA (Ball Grid Array) is used as a package of the wiring substrate 10, the package is not limited to BGA. For example, PGA (Pin Grid Array), LGA (Land Grid Array), etc. are also used.

Figure 26:
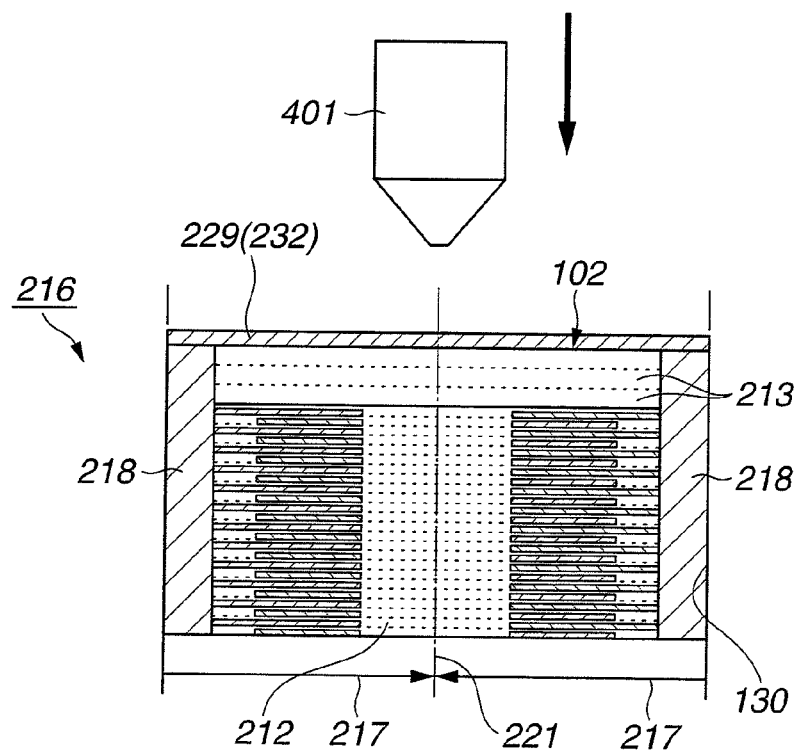
FIG. 26 is a drawing for explaining a method for manufacturing a ceramic capacitor of one other embodiment.
Figure 27:
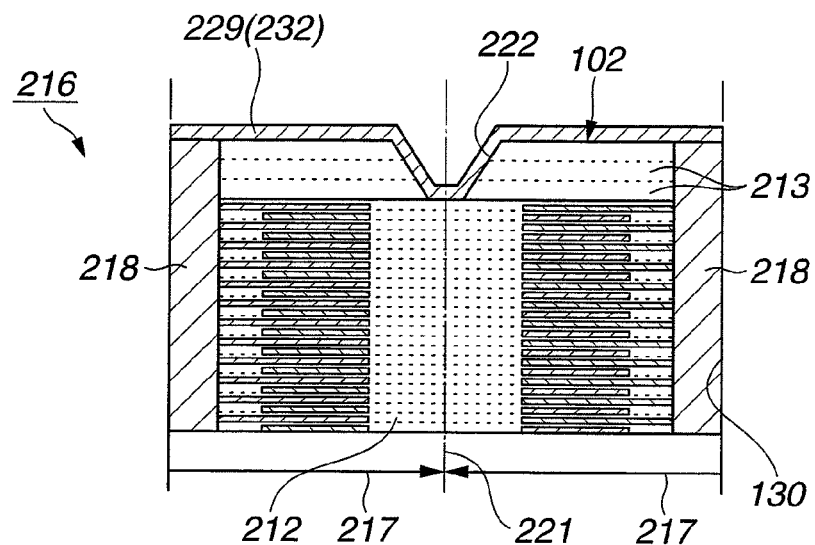
FIG. 27 is a drawing for explaining the method for manufacturing the ceramic capacitor of one other embodiment.

Instead of the above-explained manufacturing method, the following method for manufacturing the ceramic capacitor, shown in FIGS. 26 and 27, could be employed. In this method, before the groove portion forming process, the surface layer electrode part forming process in which the surface layer electrode part 229 is previously formed on the capacitor main surface 102 of the multi-device-forming multilayer unit 216 is performed (see FIG. 26). In the subsequent groove portion forming process, the surface layer electrode part 229 and the multi-device-forming multilayer unit 216 are softened to some extent by heating, and a pressing process is performed using a stamping or pressing die 401 whose tip is tapered with the surface layer electrode part 229 and the multi-device-forming multilayer unit 216 being in some soft state. More specifically, the pressing is performed so that a part of the surface layer electrode part 229 is pushed or forced into the multi-device-forming multilayer unit 216 by applying a pressing force to the surface layer electrode part 229 from above with the pressing die 401. Through this pressing process, the groove portion 222 as shown in FIG. 27 is formed.

Figure 28:
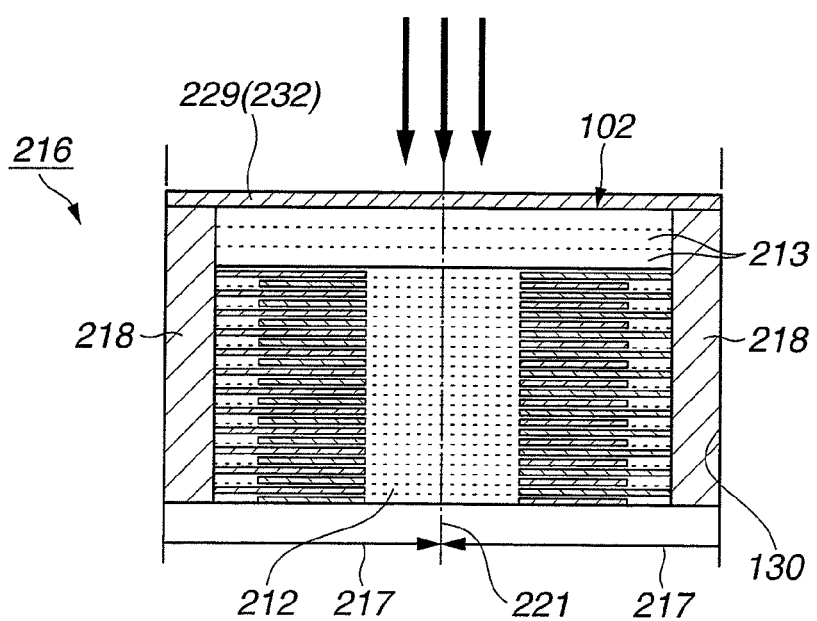
FIG. 28 is a drawing for explaining a method for manufacturing a ceramic capacitor of one other embodiment.
Figure 29:
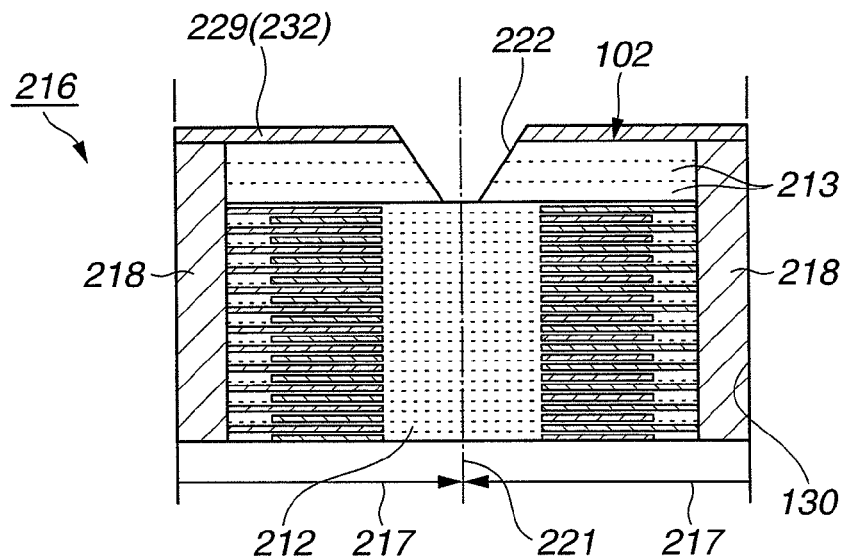
FIG. 29 is a drawing for explaining the method for manufacturing the ceramic capacitor of one other embodiment.
Figure 30:
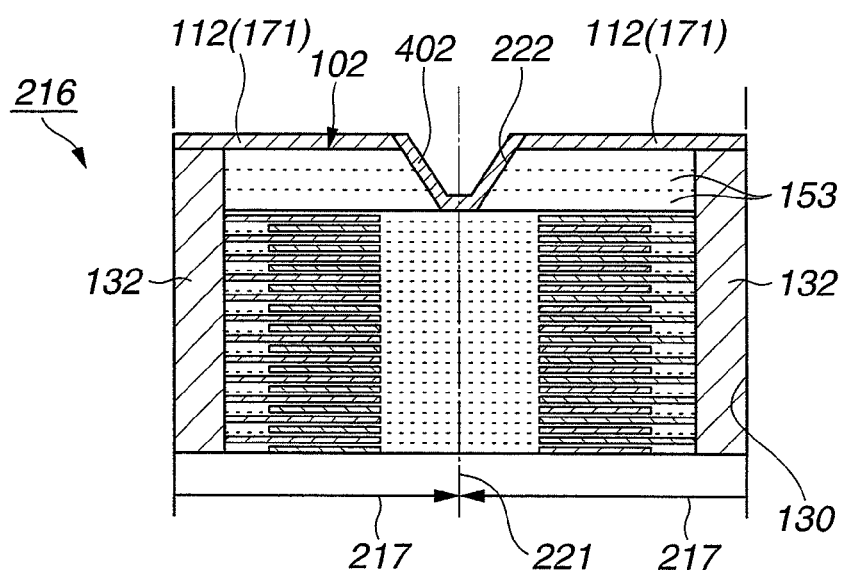
FIG. 30 is a drawing for explaining the method for manufacturing the ceramic capacitor of one other embodiment.
Figure 31:
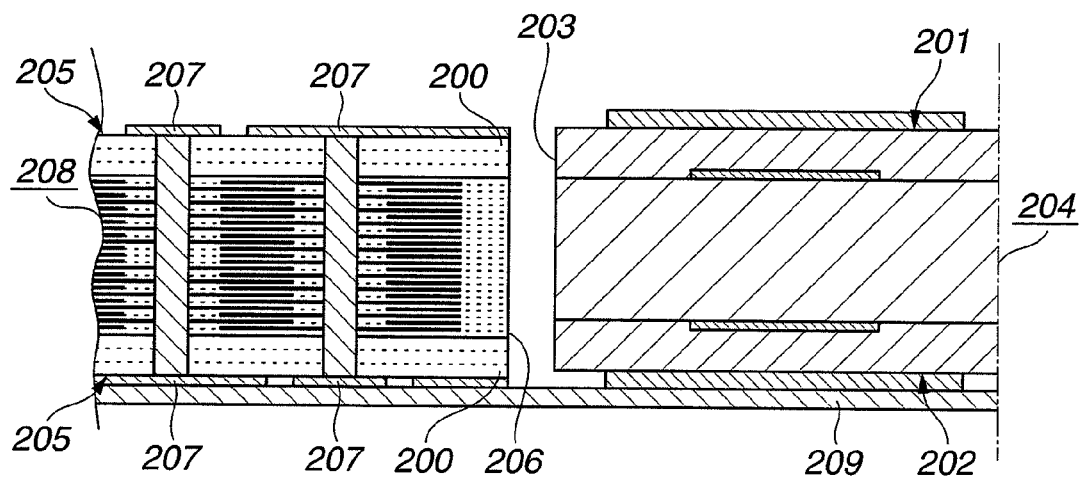
FIG. 31 is an explanation drawing of a method for manufacturing a wiring substrate according to a related art technique.
Figure 32:
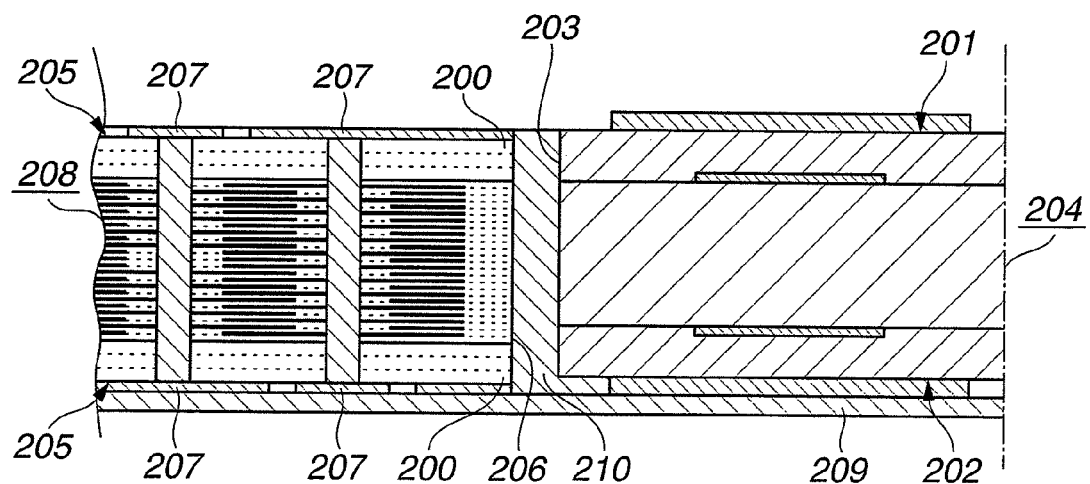
FIG. 32 is an explanation drawing of the method for manufacturing the wiring substrate of the related art technique.

Further, instead of the manufacturing methods above, the following method for manufacturing the ceramic capacitor, shown in FIGS. 28 to 30, could be employed. In this method, before the groove portion forming process, the surface layer electrode part forming process in which the surface layer electrode part 229 is previously formed on the capacitor main surface 102 of the multi-device-forming multilayer unit 216 is performed (see FIG. 28). Then by performing a laser processing to the multi-device-forming multilayer unit 216 provided with the surface layer electrode part 229, the groove portion 222 is formed. Here, after performing the laser processing, the surface layer electrode part 229 is divided along the outline 221 of the product area 217, and each surface layer electrode part 229 is electrically isolated (see FIG. 29). Thus by performing the sintering process, the multi-device-forming multilayer unit 216 is sintered, and subsequently silver paste is applied on the groove portion 222 of the sintered multi-device-forming multilayer unit 216 through printing, and further the sintering process is performed again (that is, secondary metallization is performed). As a consequence, the silver paste is sintered, thereby metalizing the groove portion 222, and the isolated surface layer electrode parts 229 are connected to each other through a metal layer 402 (see FIG. 30). In this case, it is also possible that the sintered multi-device-forming multilayer unit 216 is plated as it is with copper through electroless plating.

From the foregoing, the present invention gains the advantages and effects as follows.

In the present invention, a method for manufacturing a ceramic capacitor (101; 301) embedded in a wiring substrate (10) with a resin insulation material (92) being contiguous with an outer surface of the ceramic capacitor (101; 301), wherein the ceramic capacitor (101; 301) includes a plate-shaped capacitor body (104) having a pair of capacitor main surfaces (102, 103) which are positioned on opposite sides to each other in a thickness direction and a plurality of capacitor side surfaces (181, 182, 183, 184) and having a structure in which a plurality of internal electrodes (141, 142) are alternately layered through a ceramic dielectric layer (105, 153), the method comprises:

laminating ceramic-made green sheets (211, 212, 213), each of which becomes the ceramic dielectric layer (105, 153) afterwards, and combining the green sheets (211, 212, 213) into one, to form a multi-device-forming multilayer unit (216) in which a plurality of product areas (217), each of which becomes the ceramic capacitor (101; 301), are arranged in longitudinal and lateral directions along a plane direction; forming a groove portion (222, 223) to form a chamfer portion (162, 163) at a boundary portion between at least one of the capacitor main surfaces (102, 103) and the plurality of capacitor side surfaces (181, 182, 183, 184) through a process along an outline (221) of the product area (217); sintering the multi-device-forming multilayer unit (216) after the forming of the groove portion (222, 223); and dividing the product areas (217) into each product area (217) along the groove portion (222, 223) after the sintering.

According to the above method for manufacturing the ceramic capacitor, since the groove portion (222, 223) that becomes the chamfer portion (162, 163) is formed in the multi-device-forming multilayer unit (216) in the groove portion forming process before the sintering process, the ceramic-made green sheets (211, 212, 213), which are softer and are treated more easily than the ceramic dielectric layer (105, 153), are processed or treated for forming the groove portion (222, 223). With this, it is possible to form the chamfer portion (162, 163) in a short time and at a low cost.

Further, in a case where an aspect ratio, which is defined by a value that is obtained by dividing a length of a thickness direction of the capacitor body (104) by a length of a plane direction of the capacitor body (104), is set to, for example, 1/4 or less, application of the above method has a greater significance and is favorable. That is, when the aspect ratio is 1/4 or less, the capacitor body (104) becomes a thin plate, then there is a high possibility that the capacitor body (104) will break or chip upon the polishing of the barrel finishing process that is the related art technique described in Patent Document 2. The object of the present invention therefore arises.

Here, as an example of a favorable ceramic capacitor, it could be a chip capacitor, a capacitor having a plurality of in-capacitor via conductors (131, 132) electrically connected with a plurality of internal electrodes (141, 142) and a plurality of surface layer electrodes (111, 112, 121, 122) electrically connected with end portions (end surfaces) of the capacitor main surface (102, 103) sides at the plurality of in-capacitor via conductors (131, 132), and other capacitors. When the capacitor has the surface layer electrodes (111, 112, 121, 122), a connection with a conductor in the wiring substrate (10) is secured. As the ceramic capacitor, a via array type capacitor in which the plurality of in-capacitor via conductors (131, 132) as a whole are arranged in an array pattern is preferable. If the ceramic capacitor has such structure, reduction of inductance of the ceramic capacitor can be achieved, and noise absorption and high speed power supply for smoothing of power supply variation become possible. Further, shrinkage or reduction in size of the ceramic capacitor becomes possible, and this results in reduction in overall size of the wiring substrate. In addition, despite the small size of the ceramic capacitor, high capacitance can be obtained, and a more stable power supply becomes possible.

As the ceramic dielectric layer (105, 153), it is preferable to use a sintered compact of dielectric ceramic which has a high dielectric constant, such as barium titanate, lead titanate and strontium titanate. When using the sintered compact of dielectric ceramic, a ceramic capacitor having high capacitance can be realized. Furthermore, as the ceramic dielectric layer (105, 153), a sintered compact of high temperature sintered ceramic such as alumina, aluminium nitride, boron nitride, silicon carbide and silicon nitride, could be used. Or a sintered compact of low temperature sintered ceramic such as glass ceramic that is formed by adding inorganic ceramic filler such as alumina into borosilicate glass or borosilicate lead glass, could also be used.

The internal electrode (141, 142), the in-capacitor via conductor (131, 132) and the surface layer electrode (111, 112, 121, 122) are not particularly limited, but in a case where the above conductor and ceramic dielectric layer are formed by a simultaneous or concurrent sintering method, metal powder in the conductor must have a higher melting point than a sintering temperature of the ceramic dielectric layer. For instance, in a case where the ceramic dielectric layer is formed by the high dielectric constant ceramic (e.g. barium titanate etc.), it is possible to select nickel (Ni), copper (Cu), silver (Ag), palladium (Pd), platinum (Pt), etc. and an alloy of these materials. In addition, in a case where the ceramic dielectric layer is formed by the so-called high temperature sintered ceramic (e.g. alumina etc.), as metal powder in a metallization conductor, it is possible to select tungsten (W), molybdenum (Mo), manganese (Mn), etc. and an alloy of these materials. In a case where the ceramic dielectric layer is formed by the so-called low temperature sintered ceramic (e.g. glass ceramic etc.), as the metal powder in the metallization conductor, it is possible to select copper (Cu), silver (Ag), etc. and an alloy of these materials.

As the wiring substrate (10), it is preferable to have the core substrate (11) having the installation opening part (91) to install the ceramic capacitor therein and the wiring multilayer sections (31, 32) formed on the core main surface (12) and the core back surface (13) of the core substrate (11). Material forming this core substrate is not particularly limited, but it is preferable that the core substrate be made of mainly high polymer material. As an example of the high polymer material, it is EP resin (epoxy resin), PI resin (polyimide resin), BT resin (bismaleimide-triazine resin) and PPE resin (polyphenylether resin), etc. Further, it is also possible to use a composite material of these resins and glass fiber (glass woven fabric or glass nonwoven fabric) or organic fiber such as polyamide fiber.

Regarding the method for manufacturing the ceramic capacitor, in the laminating process, the ceramic-made green sheets (211, 212, 213), each of which becomes the ceramic dielectric layer (105, 153) afterwards, are laminated, and the green sheets (211, 212, 213) are combined into one, then the multi-device-forming multilayer unit (216) in which a plurality of product areas (217), each of which becomes the ceramic capacitor (101; 301), are arranged in longitudinal and lateral directions along a plane direction, is formed.

In the subsequent groove portion forming process, the groove portion (222, 223) to form the chamfer portion (162, 163) at the boundary portion between at least one of the capacitor main surfaces (102, 103) and the plurality of capacitor side surfaces (181, 182, 183, 184) through the process along the outline (221) of the product area (217), is formed. Here, it is preferable that a shape in cross section of the groove portion (222, 223) formed in the groove portion forming process be a tapered shape. As the tapered shape, it could be an inverted trapezoidal shape in cross section, an inverted triangle in cross section, etc. Furthermore, it is preferable that the chamfer portion (162, 163) formed by the groove portion (222, 223) be a flat shaped chamfer portion. With these shapes, the chamfer portion (162, 163) can be formed more accurately and easily than the case of the forming of the curved chamfer portion.

In the groove portion forming process, the groove portion (222, 223) could be formed through a laser processing. In this case, after the sintering process and before the dividing process, the metal layer (402) is formed on the groove portion (222, 223) by metalizing the sintered multi-device-forming multilayer unit (216). A method for forming the metal layer is not limited. For instance, it is possible to employ a so-called secondary metallization method by which a conductive paste, e.g. silver paste, is applied first through printing then the paste is sintered. With this metallization, even if the surface layer electrode part (229) is divided along the outline (221) of the product area (217) after performing the laser processing to form the groove portion, the isolated surface layer electrode parts (229) are connected to each other through the metal layer (402) formed on the groove portion (222, 223). Further, in this case, it is preferable that sintered multi-device-forming multilayer unit (216) be plated as it is through electroplating. The electroplating allows a plate layer to be easily formed in the sintered multi-device-forming multilayer unit (216) as compared with the electroless plating, and increase in productivity can be secured.

Further, in the groove portion forming process, the groove portion (222, 223) could be formed, for example, through a pressing process. In this case, it is preferable that after performing the surface layer electrode part forming process in which the surface layer electrode part (228, 229, 230, 213) that becomes the surface layer electrode (111, 112, 121, 122) connected with the end portion of the conductor section (218) on at least one of the capacitor main surfaces (102, 103) of the multi-device-forming multilayer unit (216) is formed, the groove portion (222, 223) be formed by pressing the surface layer electrode part (228, 229, 230, 213) of the multi-device-forming multilayer unit (216) from above in the groove portion forming process. More specifically, after the surface layer electrode part forming process, the surface layer electrode part (228, 229, 230, 213) and the multi-device-forming multilayer unit (216) are softened to some extent by heating, and the pressing process is performed using a desired shaped pressing die (401). Upon the pressing, the groove portion (222, 223) is formed so that a part of the surface layer electrode part (228, 229, 230, 213) is pushed or forced into the multi-device-forming multilayer unit (216) with the pressing die (401). By employing such pressing, since the part of the surface layer electrode part (228, 229, 230, 213) at the groove portion (222, 223) is not removed, there is no need to from the metal layer again afterwards. In addition, as a consequence of the pressing, adhesiveness or adhesion of the metal layer that covers the groove portion (222, 223) can be increased.

As another example except the laser processing and the pressing process, it is a cutting process by a cutting machine. As an example of the cutting process, it is a process in which a cutter blade (press cutting blade) is pressed against a certain part of the multi-device-forming multilayer unit (216) while parallel moving the cutter blade. Or also there is a process in which a rotary blade is pressed against a certain part of the multi-device-forming multilayer unit (216) while rotating and moving the rotary blade.

Additionally, it is preferable that a chamfer angle (θ2, θ3) of the chamfer portion (162, 163) with respect to the capacitor main surface (102, 103) and a chamfer angle (θ4, θ5) of the chamfer portion (162, 163) with respect to the capacitor side surface (181, 182, 183, 184) be each less than 90°.

In the subsequent sintering process, the multi-device-forming multilayer unit (216) is sintered. Here, it is preferable that before the sintering process, the grooving process in which the break groove (261, 262, 264) which opens at the bottom portion (260) of the groove portion (222, 223) and is arranged along the outline (221) of the product area (217) is formed by performing a laser processing to the bottom portion (260) be performed. With this process, the ceramic-made green sheets (211, 212, 213), which are softer and are treated more easily than the ceramic dielectric layer (105, 153), are processed or treated for forming the break groove (261, 262, 264). Thus, as compared with a case where the break groove is formed after the sintering process, it is possible to form the break groove (261, 262, 264) in a short time and at a low cost.

In addition, in the case where the shape in cross section of the groove portion (222, 223) is the inverted trapezoidal shape, when a bottom width of the groove portion (222, 223) is denoted as "d" and an opening width of each concave portion (i.e. perforations) that forms the break groove (261) is denoted as "D", it is preferable that the laser processing be performed so as to set a relationship between "d" and "D" to be "d≦D". That is, by setting such relationship, no edge appears at a boundary between an inner surface of the groove portion and an inner surface of the concave portion, and its shape becomes a continuous and smooth shape. In contrast, if the relationship is "d>D", the edge that might be an origin or start point of the occurrence of the crack appears at the boundary between both inner surfaces, this relationship is therefore unfavorable.

Further, it is preferable that after the groove portion forming process and before the sintering process, the penetration hole forming process in which the penetration hole (226) to form the side chamfer portion (161) at the boundary portion between adjacent two capacitor side surfaces (181, 182, 183, 184) is formed by performing a laser processing to the crossing area between longitudinal and lateral outlines (221) of the product area (217) be performed. With this process, the ceramic-made green sheets (211, 212, 213), which are softer and are treated more easily than the ceramic dielectric layer (105, 153), are processed or treated for forming the penetration hole (226). Thus, it is possible to form not only the chamfer portion (162, 163) but also the side chamfer portion (161) in a short time and at a low cost. Furthermore, even if a thermal stress is applied to the resin insulation material upon the installation of the ceramic capacitor in the wiring substrate with the resin insulation material being contiguous with the outer surface of the ceramic capacitor, stress concentration to the boundary portion between adjacent two capacitor side surfaces (181, 182, 183, 184) can relax because the side chamfer portion (161) is provided. With this, occurrence of the crack in the resin insulation material can be surely prevented. Moreover, since the penetration hole (226) is formed at the crossing area between longitudinal and lateral outlines (221) of the product area (217), the penetration hole (226) can be formed without losing the function of the ceramic capacitor.

Here, with respect to the side chamfer portion (161), it could be a flat shaped chamfer portion or a curved chamfer portion.

It is preferable that after the groove portion forming process and before the sintering process, the metal layer part covering process in which the corner portion (154, 155) of the capacitor body (104) which is positioned at the boundary portion between the capacitor main surface (102, 103) and the capacitor side surface (181, 182, 183, 184) is covered (or coated) with the metal layer part (232, 233) that becomes the metal layer (171, 172) be performed. With this process, since the brittle ceramic dielectric layer (153) at the corner portion (154, 155) is covered with the metal layer (171, 172) after the sintering process, toughness or tenacity of the capacitor body (104) is increased. Accordingly, even if an external stress concentrates at the corner portion (154, 155) in the processes after the sintering (e.g. upon the installation in the wiring substrate), the occurrence of the crack whose starting point is an outer peripheral surface of the ceramic capacitor can be suppressed.

As metal material that forms a part or whole of layer of the metal layer (171, 172), for example, it is copper, silver, cobalt, nickel, etc. Especially when the ceramic capacitor is the ceramic capacitor embedded in the wiring substrate, as metal material that forms an uppermost surface of the metal layer, it is far preferable to use a good conductor such as copper and silver.

It is preferable that the metal layer be formed using the same metal material as a plurality of the internal electrodes and a plurality of the surface layer electrodes. By forming the metal layer using the same metal material as the internal electrode and the surface layer electrode, there is no need to prepare other metal materials used specifically for only the metal layer, and the simultaneous or concurrent sintering in the same conditions (temperature, time) can be performed. This can keep down the cost of manufacturing.

A thickness of the metal layer is not particularly limited, but it is preferable that the thickness of the metal layer be a thickness of the plurality of the internal electrodes or thicker. For instance, a thickness of 5 μm or thicker and 50 μm or thinner (5 μm≦thickness≦50 μm) is preferable. That is, if the thickness of the metal layer is less than 5 μm, because all surfaces of the capacitor body (104) cannot be covered by the metal layer, strength or toughness may not be adequately secured, and the crack occurring in the capacitor body (104) cannot be surely prevented. On the other hand, if the thickness of the metal layer is more than 50 μm, because a part of the metal layer is prone to peeling off (or coming off) from the capacitor body, especially from the capacitor side surface, the ceramic is exposed around the corner portion (154, 155), and the crack may occur.

It is preferable that the metal layer cover not only the corner portion but the capacitor main surface and the capacitor side surface as well. With this, since the toughness or tenacity of the capacitor body (104) is further increased, the occurrence of the crack whose starting point is the outer peripheral surface of the ceramic capacitor can be surely suppressed.

Further, it is preferable that before the sintering process, the hole forming process in which the via hole (130) is formed in the multi-device-forming multilayer unit (216) by performing a laser processing, the conductor forming process in which the conductor section (218) that becomes the in-capacitor via conductor (131, 132) is formed by filling the via hole (130) with a via conductor forming material, and the layer electrode part forming process in which the surface layer electrode part (228, 229, 230, 213) that becomes the surface layer electrode (111, 112, 121, 122) connected with an end portion of the conductor section (218) is formed on at least one of the capacitor main surfaces (102, 103) of the multi-device-forming multilayer unit (216), be performed, and also it is preferable that the metal layer part covering process be performed simultaneously with the surface layer electrode part forming process. With these processes, since the brittle ceramic dielectric layer is covered with the metal layer and the surface layer electrode (111, 112, 121, 122) after the sintering process, toughness or tenacity of the capacitor body (104) is further increased. Accordingly, even if an external stress concentrates at the corner portion in the processes after the sintering (e.g. upon the installation in the wiring substrate), the occurrence of the crack whose starting point is an outer peripheral surface of the ceramic capacitor can surely be suppressed. Additionally, since the metal layer part covering process is performed simultaneously with the surface layer electrode part forming process, as compared with a case where the metal layer part covering process is performed separately from the surface layer electrode part forming process, it is possible to form the ceramic capacitor in a short time and at a low cost.

Here, in the case where the metal layer part covering process is performed simultaneously with the surface layer electrode part forming process, it is preferable that when the metal layer covers the capacitor main surface in addition to the corner portion, the metal layer be arranged while avoiding at least a part of the plurality of the surface layer electrodes and cover the capacitor main surface. With this, it is possible to prevent malfunction (short circuit etc.) that results from electrical connection between each surface layer electrode, and also to increase toughness or tenacity of the capacitor body (104).

In the subsequent dividing process, the product areas (217) is divided into each product area (217) along the groove portion (222, 223). With this process, a plurality of the ceramic capacitors can be obtained at once.

In the present invention, the following methods also gain the same advantages and effects as the above. A method for manufacturing a ceramic capacitor (101; 301) embedded in a wiring substrate (10) with a resin insulation material (92) being contiguous with an outer surface of the ceramic capacitor (101; 301), wherein the ceramic capacitor (101; 301) includes a plate-shaped capacitor body (104) having a pair of capacitor main surfaces (102, 103) which are positioned on opposite sides to each other in a thickness direction and a plurality of capacitor side surfaces (181, 182, 183, 184) and having a structure in which a plurality of internal electrodes (141, 142) are alternately layered through ceramic dielectric layers (105, 153), the capacitor body (104) has a first dielectric multilayer section (107) in which the plurality of ceramic dielectric layers (105, 153) and the plurality of internal electrodes (141, 142) are alternately layered and a second dielectric multilayer section (108) that is provided so as to be exposed at least one of the pair of capacitor main surfaces (102, 103), and a chamfer portion (162, 163) is formed at a boundary portion between at least one of the capacitor main surfaces (102, 103) and the plurality of capacitor side surfaces (181, 182, 183, 184), the method comprises: laminating ceramic-made green sheets (211, 212, 213), each of which becomes the ceramic dielectric layer (105, 153) afterwards, and combining the green sheets (211, 212, 213) into one, to form a multi-device-forming multilayer unit (216) in which a plurality of product areas (217), each of which becomes the ceramic capacitor (101; 301), are arranged in longitudinal and lateral directions along a plane direction; forming a groove portion (222, 223) to form the chamfer portion (162, 163) by performing a laser processing along an outline (221) of the product area (217); sintering the multi-device-forming multilayer unit (216) after the forming of the groove portion (222, 223); and dividing the product areas (217) into each product area (217) along the groove portion (222, 223) after the sintering.

The above method further comprises: after the forming of the groove portion (222, 223) and before the sintering, forming a penetration hole (226) to form a side chamfer portion (161) at a boundary portion between adjacent two capacitor side surfaces (181, 182, 183, 184) by performing a laser processing to a crossing area between longitudinal and lateral outlines (221) of the product area (217), and wherein, each of the chamfer portion (162, 163) and the side chamfer portion (161) is a flat shaped chamfer portion, and a chamfer depth (C2, C3) of the chamfer portion (162, 163) with respect to the capacitor main surface (102, 103) is ½₀ or more and ½ or less of a chamfer length (C1) of the side chamfer portion (161) with respect to one capacitor side surface (181, 182, 183, 184) of the adjacent two capacitor side surfaces (181, 182, 183, 184).

In the above method, in the laminating of the ceramic-made green sheets, the multi-device-forming multilayer unit is formed by laminating the plurality of ceramic-made green sheets on a supporting sheet, and wherein, the method further comprises: after the laminating of the ceramic-made green sheets and before the forming of the groove portion, forming a via hole in the multi-device-forming multilayer unit and forming, in the supporting sheet, an opening that communicates with the via hole by performing a laser processing; forming a conductor section that becomes an in-capacitor via conductor by filling the via hole and the opening with a via conductor forming material; applying a pressing force in a stacking direction to a multilayer unit that is formed from the multi-device-forming multilayer unit and the supporting sheet after the forming of the conductor section; removing the supporting sheet from the multi-device-forming multilayer unit after the applying of the pressing force; and pressing the multi-device-forming multilayer unit by applying a pressing force in the stacking direction to the multi-device-forming multilayer unit, to equalize a height of an end surface of the conductor section with a height of the capacitor main surface by crushing a protruding part of the conductor section which protrudes from the capacitor main surface, after the removing of the supporting sheet.

The entire contents of Japanese Patent Application No. 2009-132290 filed on Jun. 1, 2009 are incorporated herein by reference.

Although the invention has been described above by reference to certain embodiments of the invention, the invention is not limited to the embodiments described above. Modifications and variations of the embodiments described above will occur to those skilled in the art in light of the above teachings. The scope of the invention is defined with reference to the following claims.

What is claimed is:

1. A method for manufacturing a ceramic capacitor embedded in a wiring substrate with a resin insulation material being contiguous with an outer surface of the ceramic capacitor, wherein the ceramic capacitor includes a plate-shaped capacitor body having a pair of capacitor main surfaces which are positioned on opposite sides to each other in a thickness direction and a plurality of capacitor side surfaces and having a structure in which a plurality of internal electrodes are alternately layered through a ceramic dielectric layer, the method comprising:

laminating ceramic-made green sheets, each of which becomes the ceramic dielectric layer afterwards, and combining the green sheets into one, to form a multi-device-forming multilayer unit in which a plurality of product areas, each of which becomes the ceramic capacitor, are arranged in longitudinal and lateral directions along a plane direction;

forming a groove portion whose shape in cross section is an inverted trapezoidal shape to form a chamfer portion at a boundary portion between at least one of the capacitor main surfaces and the plurality of capacitor side surfaces through a process along an outline of the product area;

before a sintering, grooving a bottom portion of the groove portion by performing a laser processing to the bottom portion of the groove portion to form a break groove which opens at the bottom portion of the groove portion and is arranged along the outline of the product area, and the laser processing being performed so that when a bottom width of the groove portion is denoted as "d" and an opening width of a concave portion that forms the break groove is denoted as "D", a relationship between "d" and "D" is "d≦D";

sintering the multi-device-forming multilayer unit after the forming of the groove portion;

dividing the product areas into each product area along the groove portion after the sintering;

after the forming of the groove portion and before the sintering, covering a corner portion of the capacitor body which is positioned at the boundary portion between the capacitor main surface and the capacitor side surface with a metal layer part that becomes a metal layer;

before the sintering:
  forming a via hole in the multi-device-forming multilayer unit by performing a laser processing;
  forming a conductor section that becomes an in-capacitor via conductor by filling the via hole with a via conductor forming material; and
  forming, on at least one of the capacitor main surfaces of the multi-device-forming multilayer unit, a surface layer electrode part that becomes a surface layer electrode connected with an end portion of the conductor section, and wherein,
  the forming of the surface layer electrode part is performed simultaneously with the covering of the corner portion with the metal layer part wherein after forming the groove portion and before grooving the bottom portion of the groove portion, the forming of the surface layer electrode part and the covering of the corner portion with the metal layer part are performed.

2. The method for manufacturing the ceramic capacitor as claimed in claim 1, wherein:
  a shape in cross section of the groove portion formed in the forming of the groove portion is a tapered shape, and
  the chamfer portion formed by the groove portion is a flat shaped chamfer portion.

3. The method for manufacturing the ceramic capacitor as claimed in claim 2, wherein:
  a chamfer angle of the chamfer portion with respect to the capacitor main surface and a chamfer angle of the chamfer portion with respect to the capacitor side surface are each less than 90°.

4. The method for manufacturing the ceramic capacitor as claimed in claim 1, further comprising:

after the forming of the groove portion and before the sintering, forming a penetration hole to form a side chamfer portion at a boundary portion between adjacent two capacitor side surfaces by performing a laser processing to a crossing area between longitudinal and lateral outlines of the product area.

5. The method for manufacturing the ceramic capacitor as claimed in claim 1, wherein:
  in the forming of the groove portion, the groove portion is formed through a laser processing.

6. The method for manufacturing the ceramic capacitor as claimed in claim 1, wherein:
  in the forming of the groove portion, the groove portion is formed through a pressing process.

7. The method for manufacturing the ceramic capacitor as claimed in claim 6, wherein:
  after forming, on at least one of the capacitor main surfaces of the multi-device-forming multilayer unit, a surface layer electrode part that becomes a surface layer electrode connected with an end portion of the conductor section, the groove portion is formed by pressing the surface layer electrode part of the multi-device-forming multilayer unit from above in the forming of the groove portion.

8. The method for manufacturing the ceramic capacitor as claimed in claim 5, wherein:
  after the sintering and before the dividing of the product areas, a metal layer is formed on the groove portion by metalizing the sintered multi-device-forming multilayer unit.

9. The method for manufacturing the ceramic capacitor as claimed in claim 1, wherein:
  an aspect ratio, which is defined by a value that is obtained by dividing a length of a thickness direction of the capacitor body by a length of a plane direction of the capacitor body, is set to ¼ or less.

10. The method for manufacturing the ceramic capacitor as claimed in claim 1, wherein:
  after the sintering and before the dividing of the product areas, the sintered multi-device-forming multilayer unit is plated through electroplating.

11. The method for manufacturing the ceramic capacitor as claimed in claim 1, wherein:
  the break groove is perforations which are discontinuously arranged along the outline.

12. The method for manufacturing the ceramic capacitor as claimed in claim 1, wherein:
  the break groove is a slit which extends along the outline.

13. The method for manufacturing the ceramic capacitor as claimed in claim 1, wherein:
  the break groove formed on one side of the pair of capacitor main surfaces is perforations which are discontinuously arranged along the outline, and the break groove formed on the other side of the pair of capacitor main surfaces is a slit which extends along the outline, and
  the perforations and the slit are arranged on the same outline.

14. The method for manufacturing the ceramic capacitor as claimed in claim 4, wherein:
  an angle between the adjacent capacitor side surface and side chamfer portion is an obtuse angle.

* * * * *